(12) United States Patent
Kubena et al.

(10) Patent No.: US 7,015,060 B1
(45) Date of Patent: Mar. 21, 2006

(54) CLOVERLEAF MICROGYROSCOPE WITH THROUGH-WAFER INTERCONNECTS AND METHOD OF MANUFACTURING A CLOVERLEAF MICROGYROSCOPE WITH THROUGH-WAFER INTERCONNECTS

(75) Inventors: Randall L. Kubena, Oak Park, CA (US); Frederic P. Stratton, Beverly Hills, CA (US); David T. Chang, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 11/008,721

(22) Filed: Dec. 8, 2004

(51) Int. Cl.
*H01L 21/00* (2006.01)
(52) U.S. Cl. .......................... 438/50; 435/51
(58) Field of Classification Search ............ 438/48–53, 438/455–465; 216/2; 73/504.02–504.16
See application file for complete search history.

(56) References Cited

U.S. PATENT DOCUMENTS

| | | | |
|---|---|---|---|
| 5,001,940 A | 3/1991 | Ogawa .................... 74/5.6 D |
| 5,134,881 A | 8/1992 | Henrion et al. ........... 73/517 R |
| 5,203,208 A | 4/1993 | Bernstein .................... 73/505 |
| 5,313,835 A | 5/1994 | Dunn .......................... 73/505 |
| 5,377,544 A | 1/1995 | Dunn .......................... 73/505 |
| 5,511,419 A | 4/1996 | Dunn ...................... 73/504.08 |
| 5,894,090 A | 4/1999 | Tang et al. .............. 73/504.02 |
| 6,079,272 A | 6/2000 | Stell et al. ............... 73/504.12 |
| 6,164,134 A | 12/2000 | Cargille .................. 73/504.02 |
| 6,405,594 B1 * | 6/2002 | Tang et al. .............. 73/504.02 |
| 6,487,907 B1 | 12/2002 | Tang et al. .............. 73/504.02 |
| 6,539,801 B1 * | 4/2003 | Gutierrez et al. ........ 73/504.12 |
| 6,555,404 B1 * | 4/2003 | Kubena et al. ............... 438/22 |
| 6,584,845 B1 * | 7/2003 | Gutierrez et al. ........ 73/514.15 |
| 6,629,460 B1 * | 10/2003 | Challoner ................ 73/504.02 |
| 6,698,287 B1 * | 3/2004 | Kubena et al. ........... 73/504.12 |
| 6,758,093 B1 * | 7/2004 | Tang et al. .............. 73/504.02 |
| 6,944,931 B1 * | 9/2005 | Shcheglov et al. ........... 29/595 |
| 2005/0054133 A1 * | 3/2005 | Felton et al. ................. 438/50 |

OTHER PUBLICATIONS

U.S. Appl. No. 10/933,853, filed Sep. 3, 2004, Kubena et al.
U.S. Appl. No. 11/008,715, filed Dec. 8, 2004, Kubena.
Johnson, J.J., et al., "Fabrication of Silicon Masters for Micro-Contact Printing," *National Nanofabrication Users Network*, The Penn State Nanofabrication Facility, pp. 48-49 (2000).
Milanovic, V., et al., "A Simple Process for Lateral Single Crystal Silicon Nanowires," *Proceedings of IMECE '02, ASME International Mechanical Engineering Congress & Exposition*, New Orleans, Louisiana, pp. 1-7 (Nov. 17-22, 2002).
Milanovic, V, et al., "Deep Reactive Ion Etching for Lateral Field Emission Devices," *IEEE Electron Device Letters*, vol. 21, No. 6, pp. 271-273 (Jun. 2000).

(Continued)

*Primary Examiner*—Savitri Mulpuri
(74) *Attorney, Agent, or Firm*—Ladas & Parry LLP

(57) ABSTRACT

The present invention relates to a method of manufacturing a cloverleaf microgyroscope containing an integrated post comprising: attaching a post wafer to a resonator wafer, forming a bottom post from the post wafer being attached to the resonator wafer, preparing a base wafer with through-wafer interconnects, attaching the resonator wafer to the base wafer, wherein the bottom post fits into a post hole in the base wafer, forming a top post from the resonator wafer, wherein the bottom and top post are formed symmetrically around the same axis, and attaching a cap wafer on top of the base wafer.

19 Claims, 25 Drawing Sheets

OTHER PUBLICATIONS

Tang, T.K., et al., "Silicon Bulk Micromachined Vibratory Gyroscope," *Solid-State Sensor and Actuator Workshop*, Hilton Head, South Carolina, pp. 288-293 (Jun. 2-6, 1996).

Via, A., et al., "Metal Lift-Off on InP HBTs Using Carbon Dioxide Snow Spray," INTERNET: http://wwwl.boc.com/eco-snow/pdf/CS-MAX%202002.pdf 3 pages total (2002).

* cited by examiner

Figure 4a
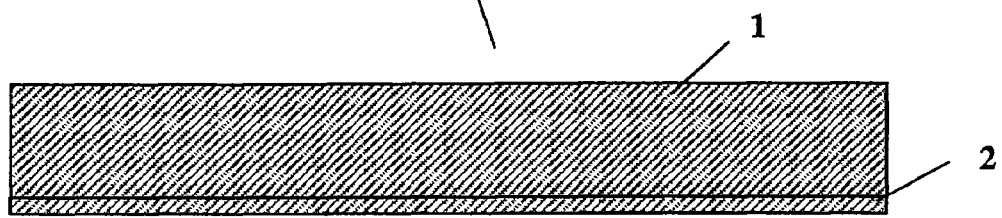
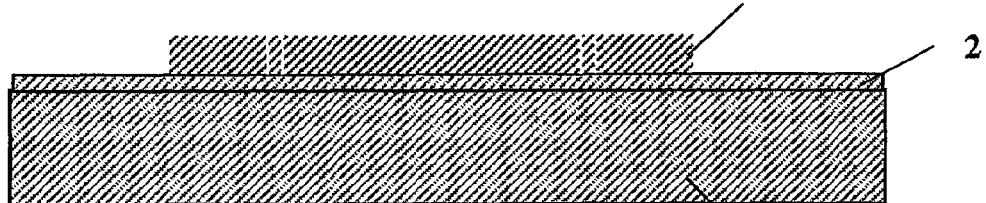
Figure 4b

CLOVERLEAF MICROGYROSCOPE WITH THROUGH-WAFER INTERCONNECTS AND METHOD OF MANUFACTURING A CLOVERLEAF MICROGYROSCOPE WITH THROUGH-WAFER INTERCONNECTS

BACKROUND OF THE INVENTION

1. Field of the Invention

The present invention refers to a cloverleaf microgyroscope and a method of manufacturing a cloverleaf microgyroscope that contains a single crystal silicon cloverleaf-shaped resonator and integrated post attached to the leaves with through-wafer interconnects.

2. Description of Related Art

U.S. Pat. No. 5,894,090 to Tang et al., which is incorporated herein by reference, discloses a micromachined symmetrical leaf structure having a plurality of symmetrically disposed leaves about a defined center. At least one micromachined spring is disposed symmetrically with respect to the symmetrical leaf structure and supporting the symmetrical leaf structure, a rim/base structure to which the spring is coupled. The rim/base structure includes a plurality of sensing and drive electrodes and a circuit electrically coupled to the electrodes included within the rim/base structure. The circuit provides drive signals to the drive electrodes to oscillate the symmetrical leaf structure and to receive a sensing signal from the sensing electrodes to detect response of the oscillating symmetrical leaf structure to physical phenomena exterior to the micromachined resonator. The micromachined resonator has a manually inserted post. It shows a lack of a silicon based vacuum encapsulation. A low yield is obtained during the separation. The manufacturing of the resonator involves high fabrication costs. It shows large vibration sensitivity and no clear path to electronic integration.

The known manufacturing processes make it very difficult to manufacture a microgyroscope. The central post is inserted by hand, the device has to be vacuum packaged in a custom package and there is no ability to integrate control electronics with the silicon structure.

Although electrical through-wafer vias have been used for many years for standard ICs, the use of deep (>500 microns) vias with MEMS within a wafer-level vacuum package has not been attempted to our knowledge. In addition, standard pn junction techniques for electrical isolation are not satisfactory for the extremely high levels of isolation that must be achieved for MEMS devices. Also, standard poly fills of etched vias are not useful since the front side contacts (control electrodes for the MEMS device) must be perfectly smooth for the microgyro. This is needed to produce a high degree of reproducibility of the measured capacitance between the plates. The use of spray resist techniques allows us to perform lithography in high-aspect ratio holes, and thus create the desired structure.

What are needed are a cloverleaf microgyroscope and a process for manufacturing a cloverleaf microgyroscope with an integrated central post and electronics with the resonator and vacuum package at wafer-level with a single crystal silicon construction.

BRIEF SUMMARY OF THE INVENTION

This invention addresses the above needs.

One aspect of the present invention is a method of manufacturing a cloverleaf microgyroscope containing an integrated post comprising:

a) attaching a post wafer to a resonator wafer,
b) forming a bottom post from the post wafer,
c) preparing a base wafer with through-wafer interconnects,
d) attaching the resonator wafer to the base wafer, wherein the bottom post fits into a post hole in the base wafer,
e) forming a top post from the resonator wafer, wherein the bottom and top post are formed symmetrically around the same axis, and
f) attaching a cap wafer on top of the base wafer.

Another aspect of the present invention is a cloverleaf microgyroscope manufactured by this method.

The construction of a microgyroscope has a single crystal silicon cloverleaf-shaped resonator and integrated post attached to the leaves. The microgyroscope device array is fabricated by bonding two separate substrates together using a gold/gold thermo compression technique; one contains the cloverleaf resonator structures fabricated from silicon-on-insulator (SOI) and bulk silicon substrates, and the other contains the support pillars and electrode metal. A fourth wafer containing an array of etched cavities and openings which allow the bonding of electrical wires from metal pads to the device wafer in a vacuum, thus hermetically sealing each individual microgyroscope.

This disclosure describes a new concept of using deep through-wafer vias combined with wafer-level vacuum packaging to produce all-Si microgyros with ball-grid array interconnects on the bottom wafer. High-aspect ratio lithography using spray-on resist and DRIE are utilized with conformal dielectric coatings and metal plating from the backside to form the through-wafer interconnects. For base wafer thicknesses of about 800 microns, the proposed lateral dimension of the vias is about 200 microns, which is consistent with the size of the gyro's control electrodes.

BRIEF DESCRIPTION OF THE SEVERAL VIEWS OF THE DRAWINGS

These and other features, aspects and advantages of the present invention will become better understood with reference to the following description, appended claims, and accompanying drawings where

FIG. 4a is a cross-sectional view at line 3b—3b of the bond wafer B;

FIG. 4b is a cross-sectional view at line 2b—2b of bonded to wafer A;

DETAILED DESCRIPTION

The following disclosure provides the construction of a microgyroscope that has a single crystal silicon cloverleaf-shaped resonator and integrated post attached to the leaves. The microgyroscope device is fabricated by bonding two separate substrates together preferably using a gold/gold thermocompression technique; one contains the cloverleaf resonator structures fabricated from SOI and bulk silicon substrates, and the other contains the support pillars, electrode metal, and through-wafer interconnects. A fourth wafer containing an array of etched cavities is solder-bonded to the device wafer in a vacuum, thus hermetically sealing each individual microgyroscope.

Figure 1A:
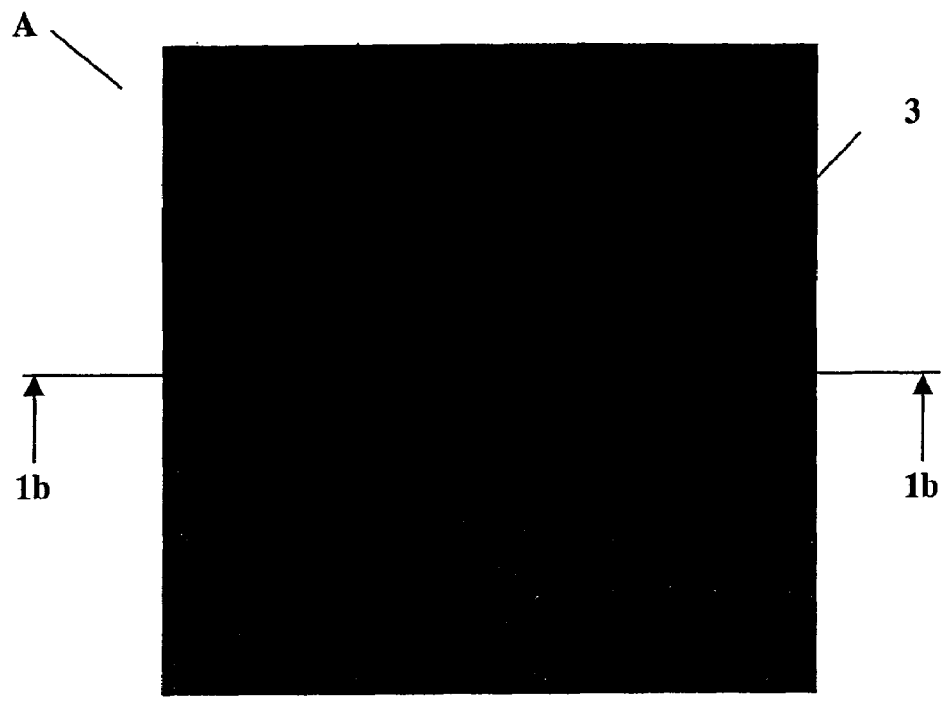
FIG. 1a is a top plan view of the preferred starting material of a resonator SOI wafer A and FIG. 1b is a cross-sectional view through wafer A of FIG. 1a at line 1b—1b of the resonator SOI wafer A.
Figure 1B:
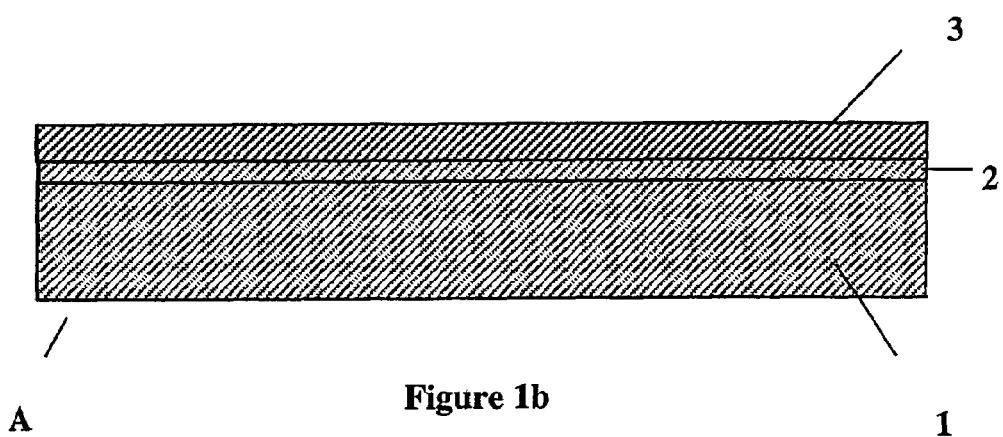

The resonator wafer A, preferably a SOI wafer, is preferably prepared first. On a bulk silicon base 1 having a preferable thickness of $\leq 500$ µm, which is optionally lightly-doped bulk silicon about 1e15 $cm^{-3}$, a silicon dioxide layer 2 having a preferable thickness of $\leq 2$ µm is formed preferably by thermal oxidation at a temperature between 800° C. and 1000° C. On top of the silicon dioxide layer 2 a heavily doped silicon epi-layer, p-type, 1e19–1e20 $cm^{-3}$ 3 is provided having a preferable thickness of 10 µm to 20 µm, as shown in FIGS. 1a and 1b.

Figure 2A:
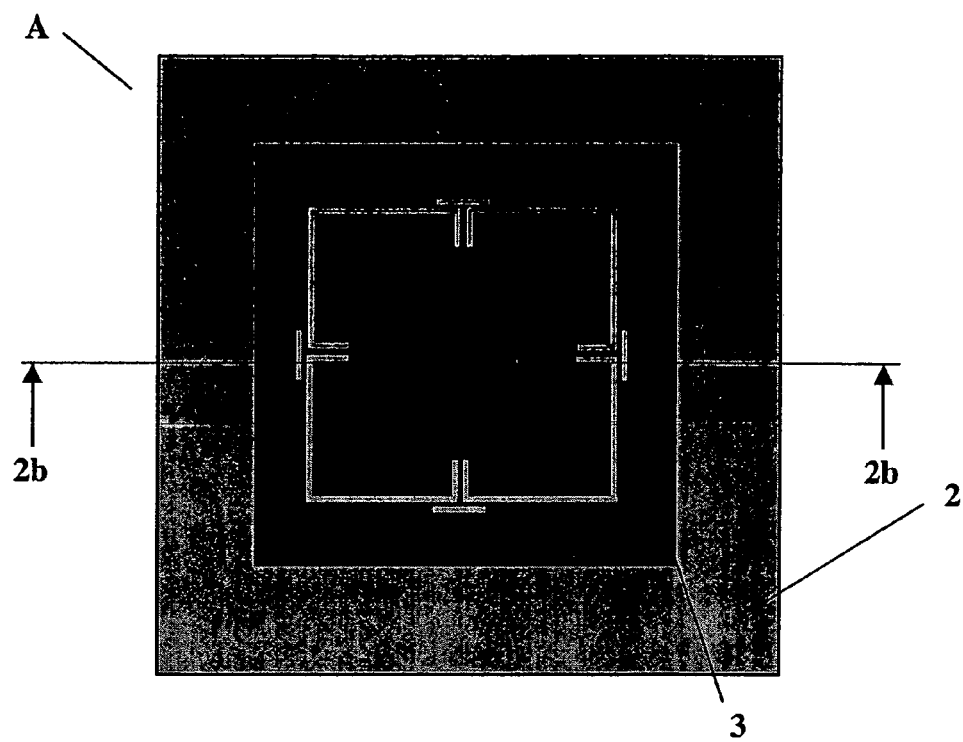
FIG. 2a is a top plan view of the preferred starting material of a resonator SOI wafer A and FIG. 2b is a cross-sectional view through wafer A of FIG. 2a at line 2b—2b of the resonator SOI wafer A.
Figure 2B:
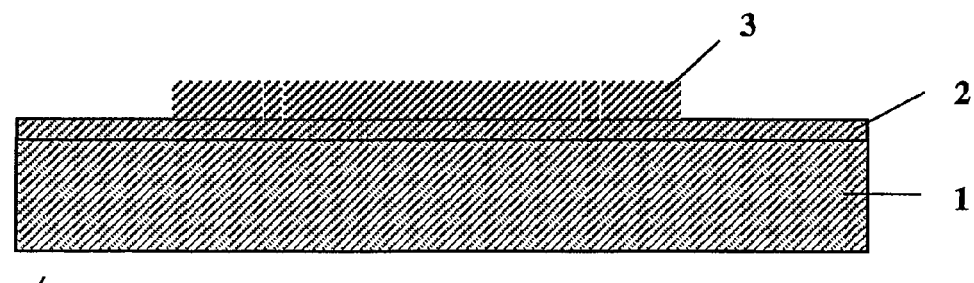

Then the cloverleaf petal and spring of the resonator wafer A is prepared. Parts of the heavily doped silicon epi-layer 3 are preferably removed by photoresist lithography, deep reactive ion etching (DRIE) and photoresist removal, as shown in FIGS. 2a and 2b. Photoresist lithography and DRIE are described in inter alia Veljko Milanovic et al. "Deep Reactive Ion Etching for Lateral Field Emission Devices", IEEE Electron Device Letters, Vol. 21, No. 6, June 2000, which is incorporated herein by reference.

The process preferably comprises:
1. The top silicon layer of the wafer is coated with a layer of photoresist.
2. Light from an illuminator is projected through a mask that contains the pattern to be created on the wafer. That light patterns that pass through the mask are projected onto the photoresist-coated layer.
3. The photoresist that is exposed to the light becomes soluble and is rinsed away, leaving miniature images of the mask pattern. It remains as an etch mask on the silicon surface of the wafer.

4. Regions unprotected by photoresist are etched preferably by gases utilizing Deep Reactive Ion Etching (DRIE). DRIE involves repeated exposure of a photoresist-masked silicon wafer to an etchant (usually $SF_6$) plasma in alternation with a passivant (usually $C_4F_8$) plasma. So the etching process preferably cycles between etching and deposition steps several times to achieve a deep etching with a quite vertical profile. The etch rate, profile and selectivity to the mask are controlled by adjusting etch and passivation step efficiency or the time ratio of the two steps. Average etch rate is around 2.7 $\mu$m/min, and etching is terminated when the $SiO_2$ layer 2 is reached. The $SiO_2$ layer 2 serves as a stop layer.

5. After the DRIE process the photoresist is removed. Photoresist removal with solvents is a preferred process in the semiconductor manufacturing and is used extensively after any metal processing. Organic strippers may have any number of different components such as NMP, glycol ether, amine, and DMSO.

The process parameters for the photoresist lithography are preferably as follows:
a) Resist Application:
2.07 $\mu$m
AZI 1350J, 3500 RPM
100° C. Hotplate bake for 45 sec.
b) Resist Exposure:
Photomask # C1
Time=7 sec.
Mask Offset=0.2 $\mu$m
c) Develop & Bake:
MF351:$H_2O$, 1:5 for 60 sec
100C Hotplate Bake for 45 sec.

Figure 3A:
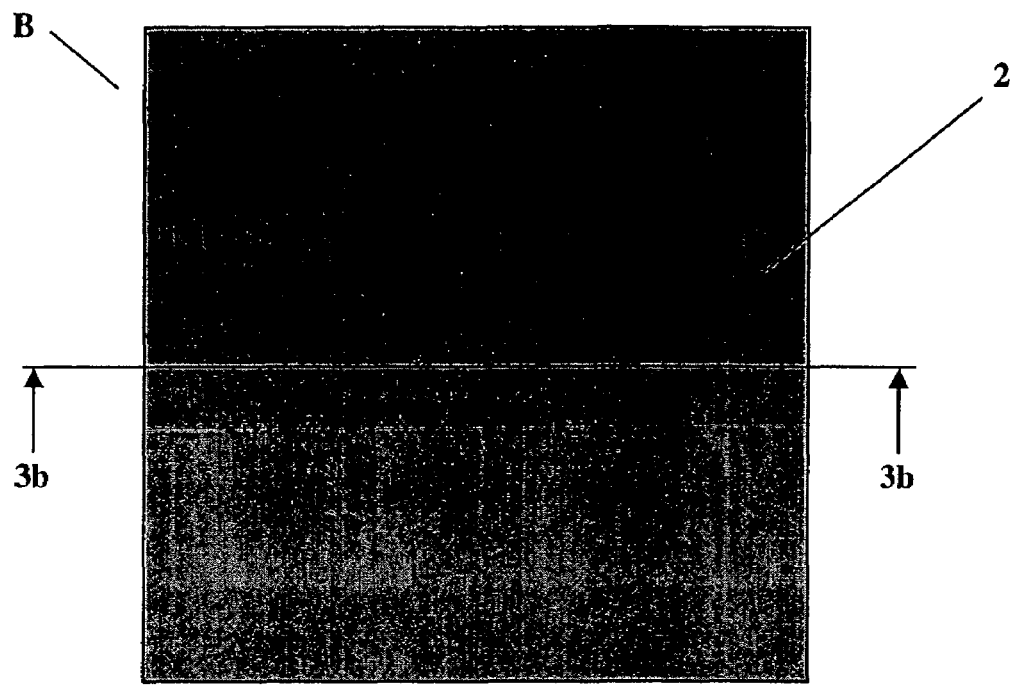
FIG. 3a is a top plan view of the preferred starting material of a resonator SOI wafer B and FIG. 3b is a cross-sectional view through wafer B of FIG. 3a at line 3b—3b of the bottom-portion wafer B.
Figure 3B:
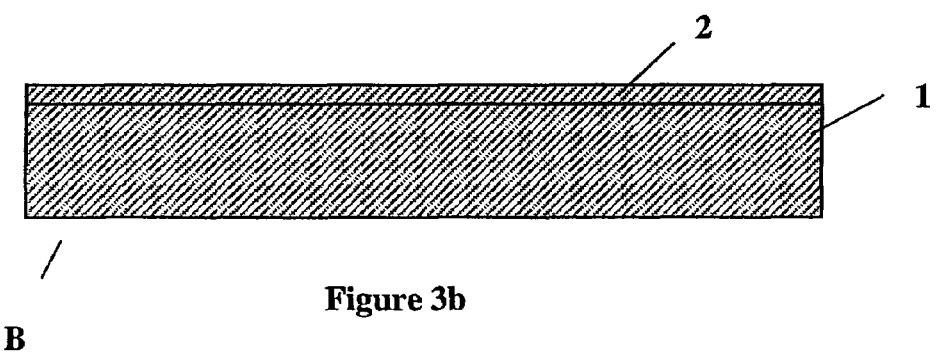

The bottom post wafer B is prepared next. On a bulk silicon base 1 having a preferable thickness of $\leq$500 $\mu$m, which is optionally lightly-doped bulk silicon layer (about 1e15 $cm^{-3}$) 2 a silicon dioxide layer, having a preferable thickness of $\leq$2 $\mu$m, is formed preferably by thermal oxidation between 800° C. and 1000° C. as shown in FIGS. 3a and 3b.

Wafer B is bonded to resonator wafer A. The bondage between heavily-doped silicon epi-layer 3 of the bottom portion of wafer A and the silicon dioxide layer 2 of the wafer B may be achieved by heating at a temperature from 800° C. to 1000° C., as diagrammatically shown in FIGS. 4a and 4b. In this process the $SiO_2$ layer 2 of wafer B is preferably bonded to the heavily doped silicon epi-layer, 3 of the SOI wafer A. The epi-layer 3 is preferably p-type, 1e19–1e20 $cm^{-3}$.

Figure 5A:
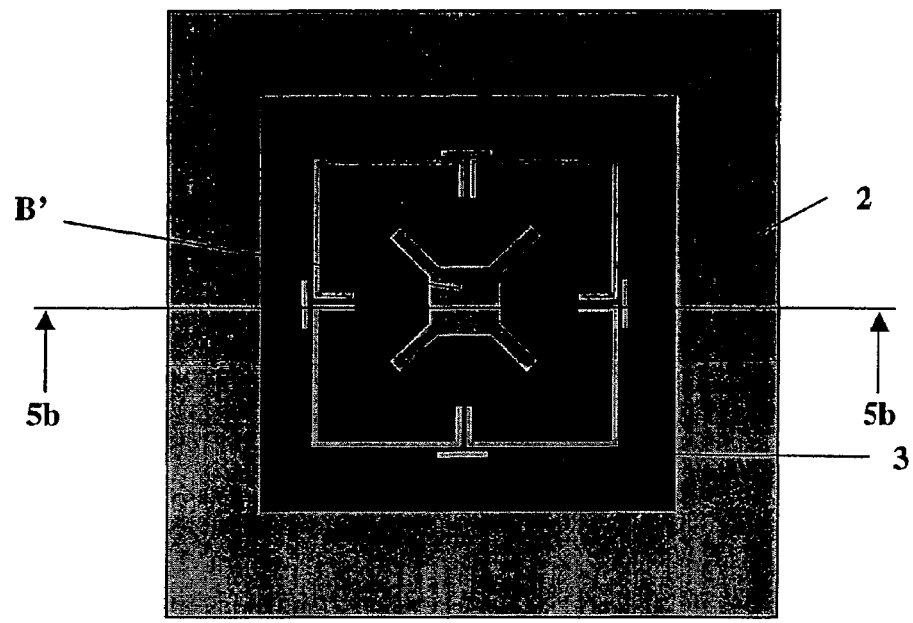
FIG. 5a is a top plan view of the resonator SOI wafer A and a bottom post B' and FIG. 5b is a cross-sectional view through wafer A and bottom post B' of FIG. 5a at line 5b—5b of the resonator SOI wafer A and bottom post B'.
Figure 5B:
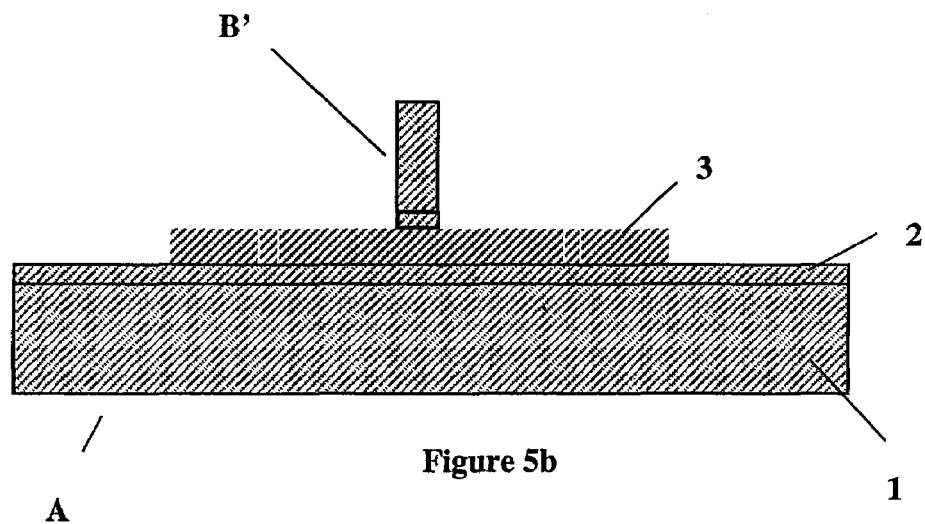

Then the bottom post B' and rib pattern are prepared. The bulk silicon layer 1 and silicon dioxide layer 2 of the wafer B have been partially removed to yield a post B' as shown in FIGS. 5a and 5b.

The process preferably comprises:
1. Coating the top silicon layer 1 of the wafer B with a layer of photoresist,
2. Projecting light from an illuminator through a mask that contains the pattern to be created on the wafer B,
3. Washing the exposed regions of the photoresist layer and leaving an etch mask on the silicon surface of the wafer B.
4. Etching silicon layer 1 unprotected by photoresist by gases utilizing the deep reactive ion etch (DRIE).
5. Removing $SiO_2$ layer 2 of wafer B by $CF_4/O_2$ plasma etch, and
6. Removing photoresist on the surface of the post B'.

Figure 6A:
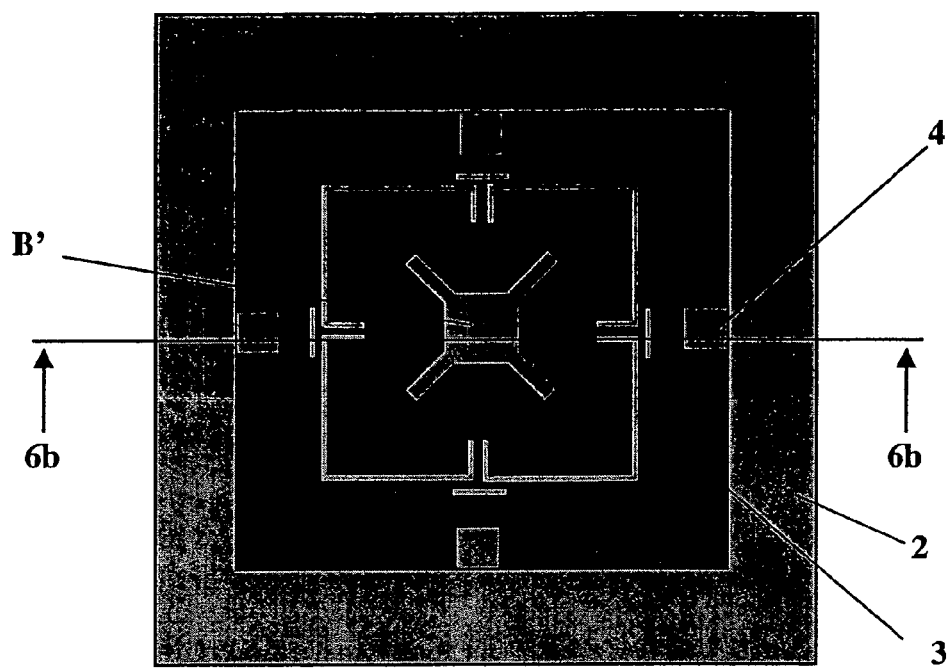
FIG. 6a is a top plan view of the resonator SOI wafer A and a bottom post B' and FIG. 6b is a cross-sectional view through wafer A and bottom post B' of FIG. 6a at line 6b—6b of the resonator SOI wafer A and bottom post B' after several contacts are attached to it.
Figure 6B:
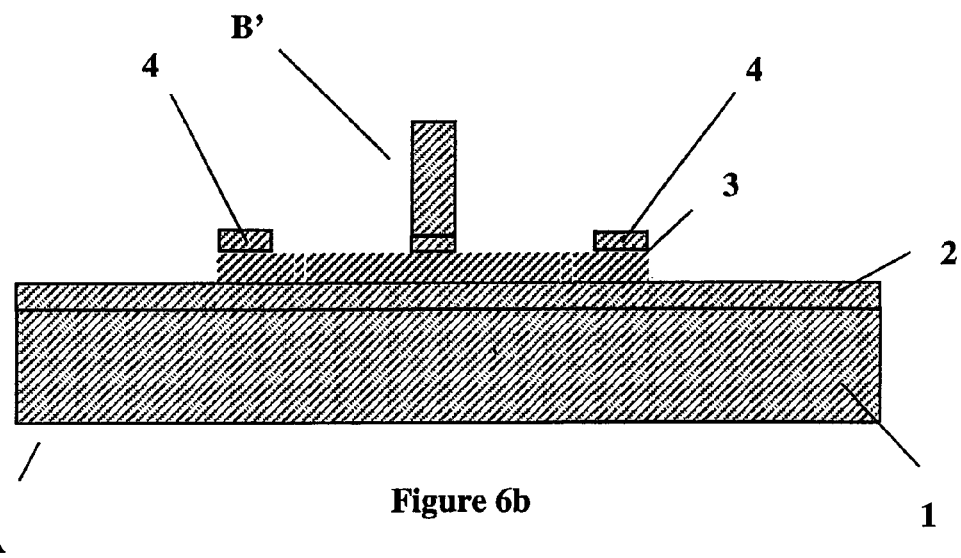

Then ohmic contacts are formed. On the heavily doped silicon epi-layer 3 several contacts 4 are preferably formed by sputtering metal. The contacts 4 are preferably placed symmetrically around the post B'. The contacts 4 contain preferably Ti/Pd/Au, Ti/Pt/Au or mixtures thereof. The contacts 4 are prepared for example by photoresist lithography, wet etching the metal and removing the photoresist (photoresist spray lithography, metallization Ti/Pt/Au and metal lift-off), as shown in FIGS. 6a and 6b. Metal liftoff is a common means of creating narrow metal lines for metals. A metal liftoff process is preferably done in a spray system. The process of resist photoresist, spray lithography, metallization and metal lift-off is described for example, in inter alia, Andrea Via et al. "Metal Lift-off on InP HBTs Using Carbon Dioxide Snow Spray" (see: www1.boc.com/ecosnow/pdf/CS-MAX%202002.pdf.)

The process preferably comprises:
1. Coating the heavily doped silicon epi-layer, p-type, 1e19–1e20 $cm^{-3}$ 3 of the wafer A by metallization with sputter metal (Ti/Pd/Au).
2. Coating metal (Ti/Pd/Au) on the layer 3 with a layer of photoresist,
3. Projecting light from an illuminator through a mask that contains the pattern, namely the places for the ohmic contacts 4 to be created, on the layer 3 of wafer A,
4. Washing the exposed regions of the photoresist layer and leaving an etch mask on the silicon surface of the wafer A, Removing the metal which is not covered by photoresist by wet etch,
5. Removing photoresist on the surface of the ohmic contacts 4.

The process for photoresist spray lithography, metallization Ti/Pt/Au and metal lift-off preferably comprises:
1. Coating layer 3 with a layer of photoresist,
2. Projecting light from an illuminator through a mask that contains the pattern, namely the places for the ohmic contacts Ti/Pt/Au 4 to be created, on the layer 3 of wafer A,
3. Washing the exposed regions of the photoresist layer and leaving an etch mask on the silicon surface of the wafer A, Removing the metal which is not covered by photoresist by wet etch,
4. Depositing Ti/Pt/Au 4 by spray lithography,
5. Removing Ti/Pt/Au 4 covering the photoresist by a metal lift-off process,
6. Stripping the remaining photoresist yielding a Ti/Pt/Au 4 pattern on the surface of wafer C.

Figure 7A:
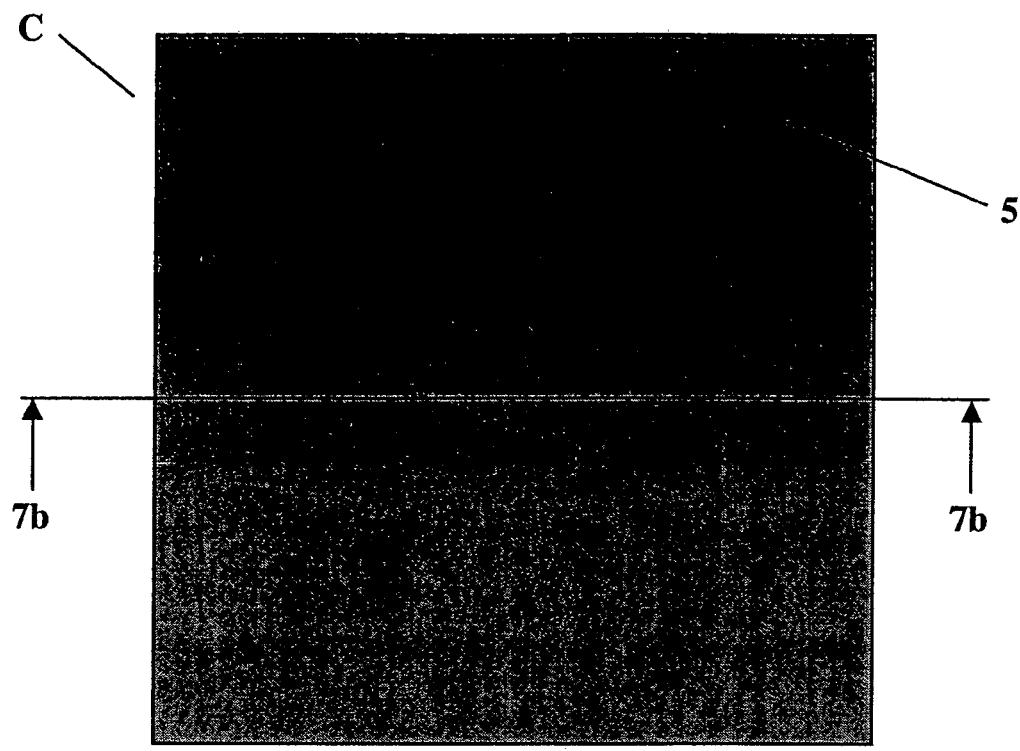
FIG. 7a is a top plan view of the preferred starting material of a base wafer C and FIG. 7b is a cross-sectional view through wafer C of FIG. 7a at line 7b—7b of the base wafer C.
Figure 7B:
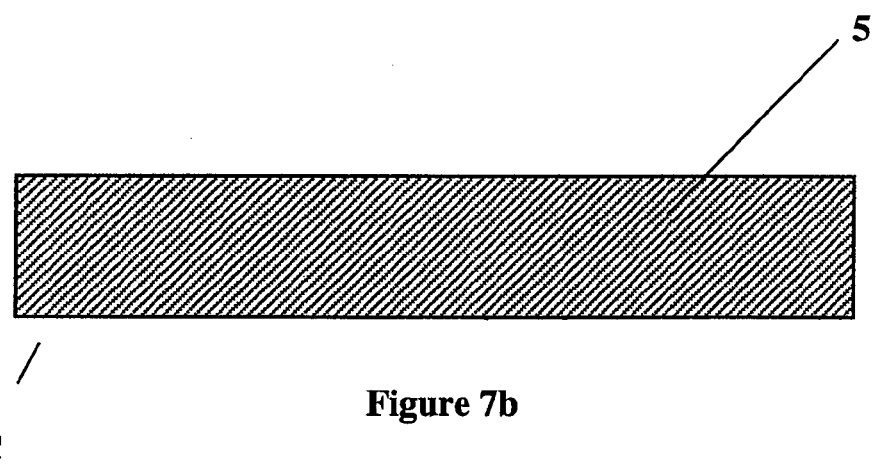

Then a base wafer C is prepared. The preferred starting material 5 of the base wafer C has a preferable thickness of about $\leq$800 $\mu$m and preferably contains a moderately doped silicon substrate p-type, 1e 19 $cm^{-3}$, as shown in FIGS. 7a and 7b.

Figure 8A:
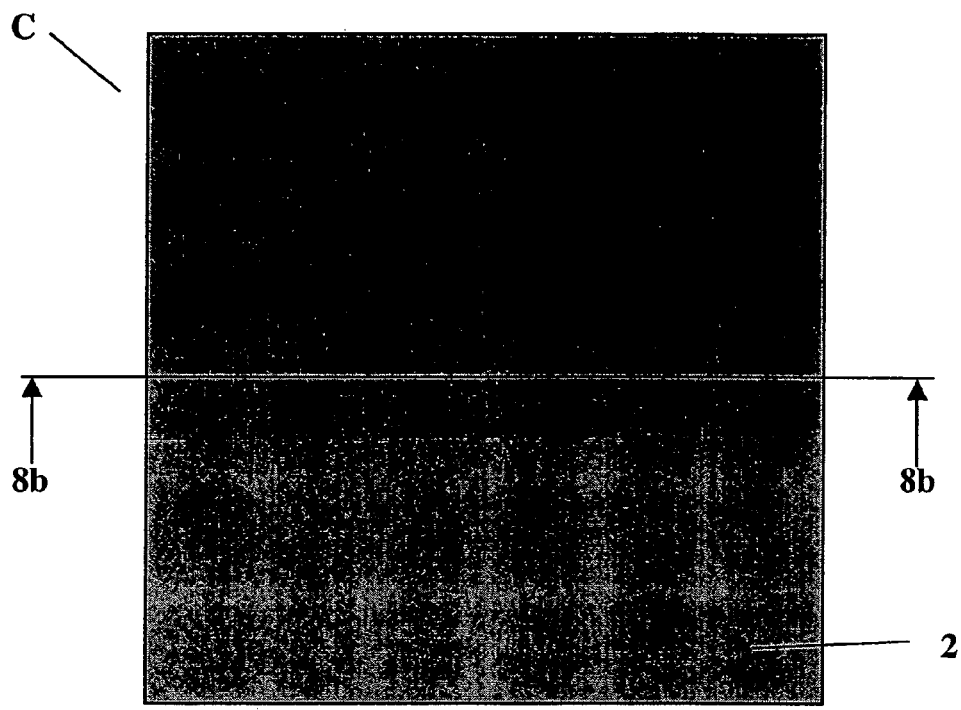
FIG. 8a is a top plan view of the preferred starting material of the base wafer C and FIG. 8b is a cross-sectional view through wafer C of FIG. 8a at line 8b—8b of the base wafer C, after on both surfaces of base wafer C a silicon dioxide layer is grown.
Figure 8B:
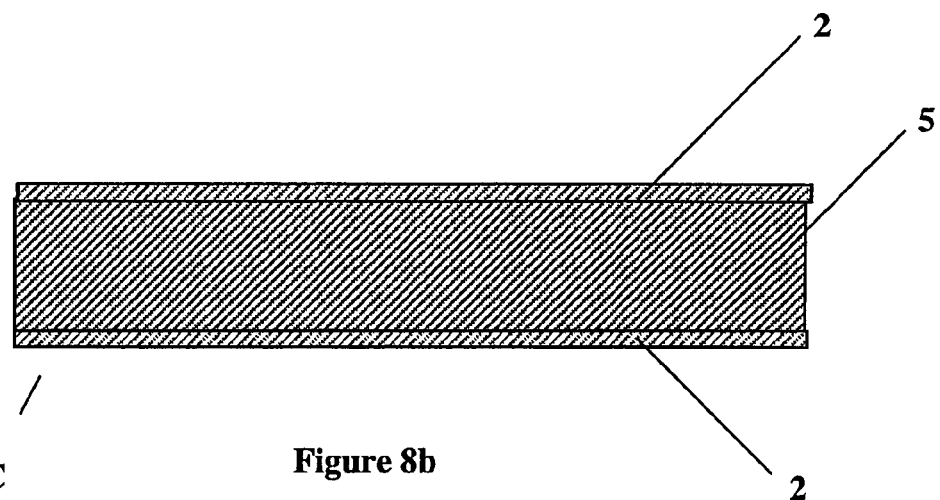

On both surfaces of the preferred starting material 5 of the base wafer C a silicon dioxide layer 2 of $\leq$0.3 $\mu$m-thick is grown by thermal oxidation at a temperature preferably of about 950° C., as shown in FIGS. 8a and 8b.

Figure 9A:
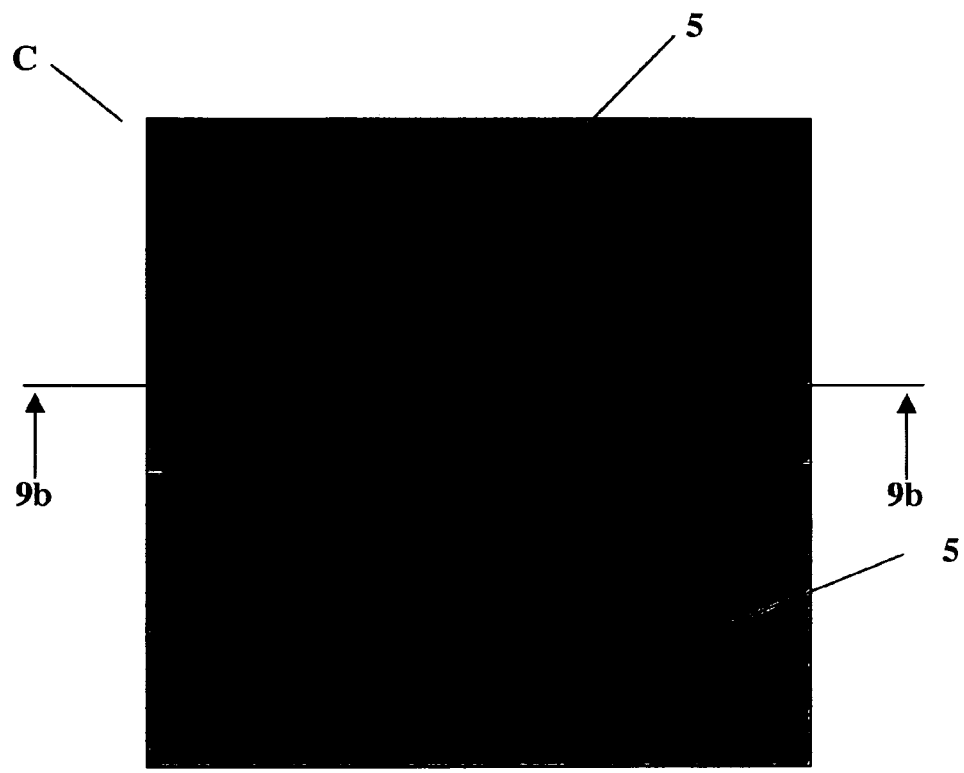
FIG. 9a is a top plan view of the preferred starting material of the base wafer C and FIG. 9b is a cross-sectional view through wafer C of FIG. 9a at line 9b—9b of the base wafer C, after pillar fabrication.
Figure 9B:
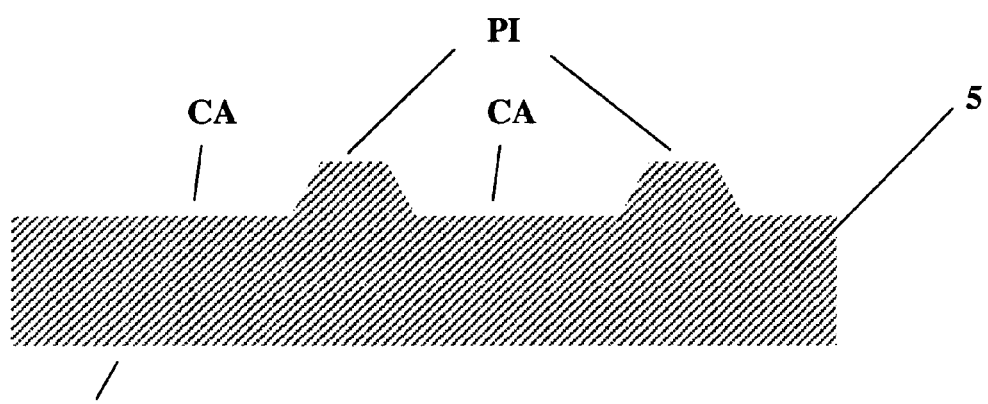

Then a pillar fabrication is carried out. From the preferred starting material 5 a thickness of preferably about 5 $\mu$m to 8 $\mu$m is removed by photoresist lithography, wet etch $SiO_2$ and photoresist removal, wet KOH etch of silicon and $SiO_2$ removal in order to obtain pillars PI, as shown in FIGS. 9a and 9b.

The process preferably comprises:
1. Coating the top and bottom $SiO_2$ layer 2 of wafer C with a layer of photoresist, 2. Projecting light from an illuminator through a mask that contains the pattern, namely the places for the pillars PI to be created, on the top layer 2 of wafer C,
3. Washing the exposed regions of the photoresist layer and leaving an etch mask on the $SiO_2$ layer 2 of the wafer C,
4. Removing the $SiO_2$ layer 2, which is not covered by photoresist, by $CF_4/O_2$ plasma etch,
5. Removing 5–8 μm of moderate doped Si preferred starting material 5 by wet KOH etch to produce a cavity CA,
6. Removing remaining photoresist, and
7. Removing $SiO_2$ layer 2 on the pillars and on the bottom layer by $CF_4/O_2$ plasma etch.

Figure 10A:
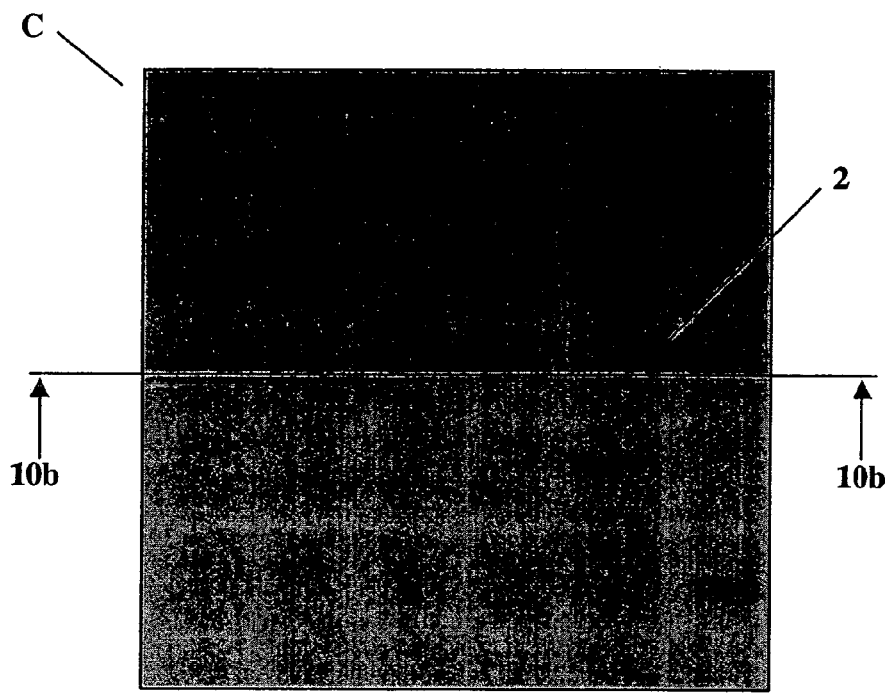
FIG 10a is a top plan view of the preferred starting material of the base wafer C and FIG. 10b is a cross-sectional view through wafer C of FIG. 10a at line 10b—10b of the base wafer C, after on both surfaces of base wafer C a silicon dioxide layer is grown.
Figure 10B:
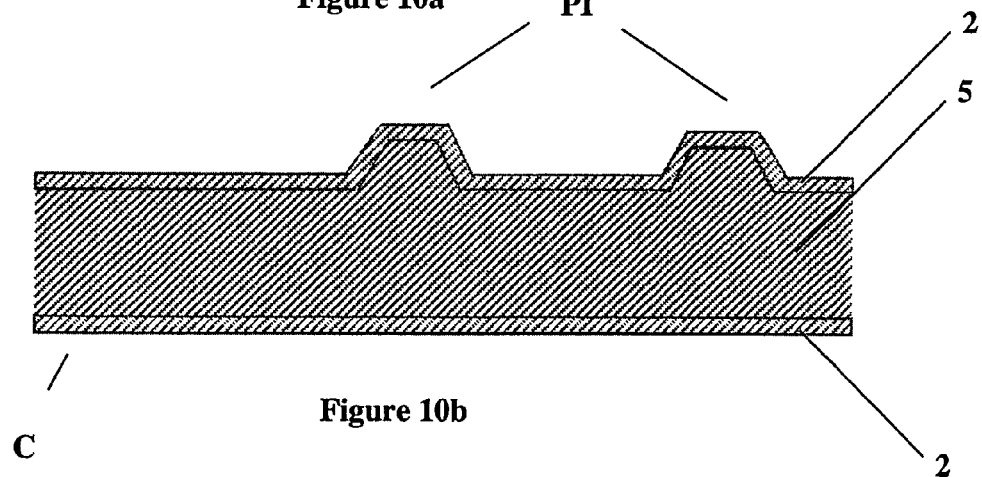

On both surfaces of the preferred starting material 5 of the base wafer C (with pillars PI) a $SiO_2$ layer of $\leq 2$ μm thick is provided, preferably by thermal oxidation at a temperature of about 1050° C., as shown in FIGS. 10a and 10b.

Figure 11A:
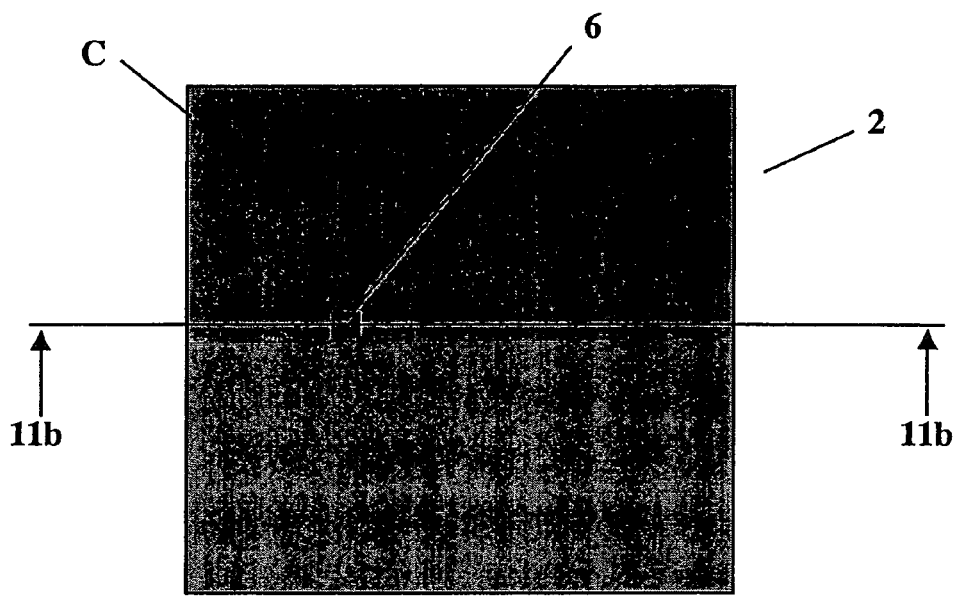
FIG. 11a is a top plan view of the preferred starting material of the base wafer C and FIG. 11b is a cross-sectional view through wafer C of FIG. 11a at line 11b—11b of the base wafer C after an ohmic contact.
Figure 11B:
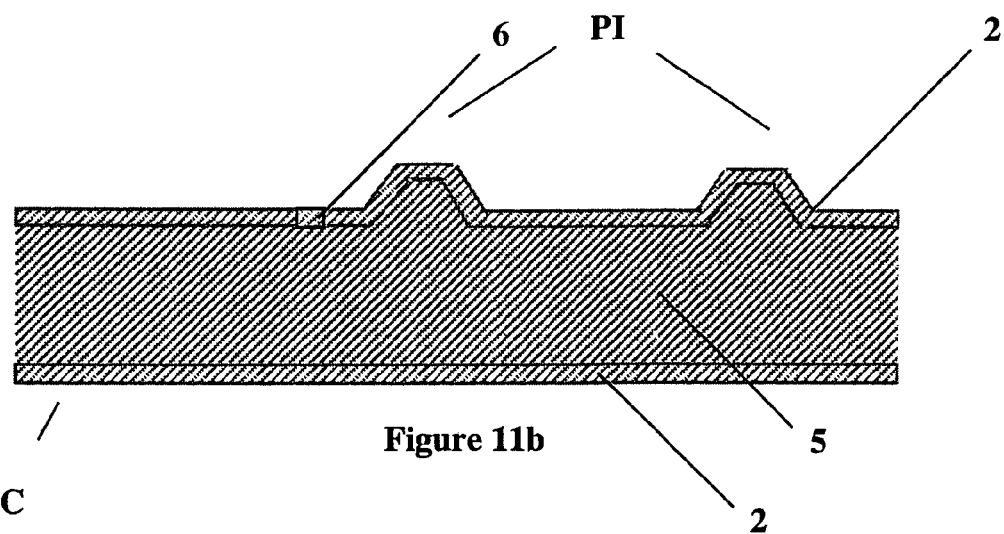

An ohmic contact metal Al 6 and interconnect metal Ti/Al 7 may be attached to the preferred starting silicon material 5 of the base wafer C by photoresist spray lithography and metal deposition and liftoff, as shown in FIGS. 11a and 11b.

The process preferably comprises:
1. Coating $SiO_2$ layer 2 with a layer of photoresist,
2. Projecting light from an illuminator through a mask that contains the pattern, namely the places for the ohmic contact Al 6 to be created on the layer 2 of wafer C,
3. Washing the exposed regions of the photoresist layer and leaving an etch mask on the $SiO_2$ layer 2 of the wafer C,
4. Removing the $SiO_2$ layer 2 by wet etch which is not covered by photoresist,
5. Depositing Al 6 by spray lithography,
6. Removing Al 6 covering the photoresist by a metal lift-off process,
7. Stripping the remaining photoresist yielding an Al 6 pattern on the surface of wafer C.

Figure 12A:
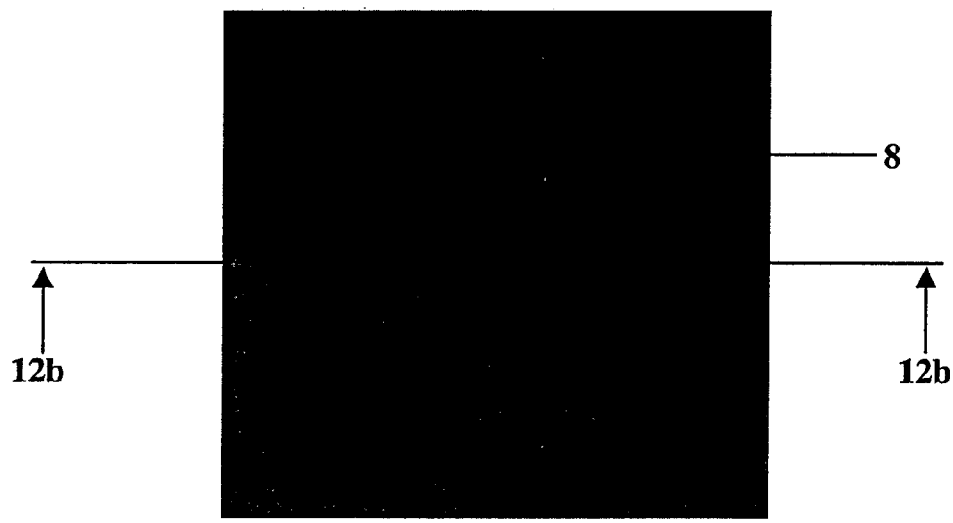
FIG. 12a is a top plan view of the preferred starting material of the base wafer C and FIG. 12b is a cross-sectional view through wafer C of FIG. 12a at line 12b—12b of the base wafer C after front side metal deposition.
Figure 12B:
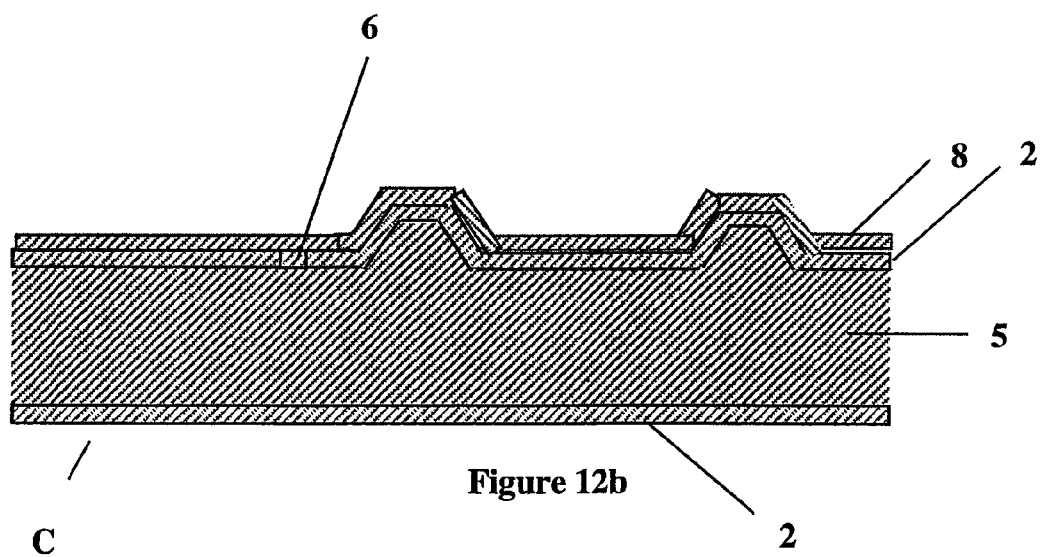
Figure 13A:
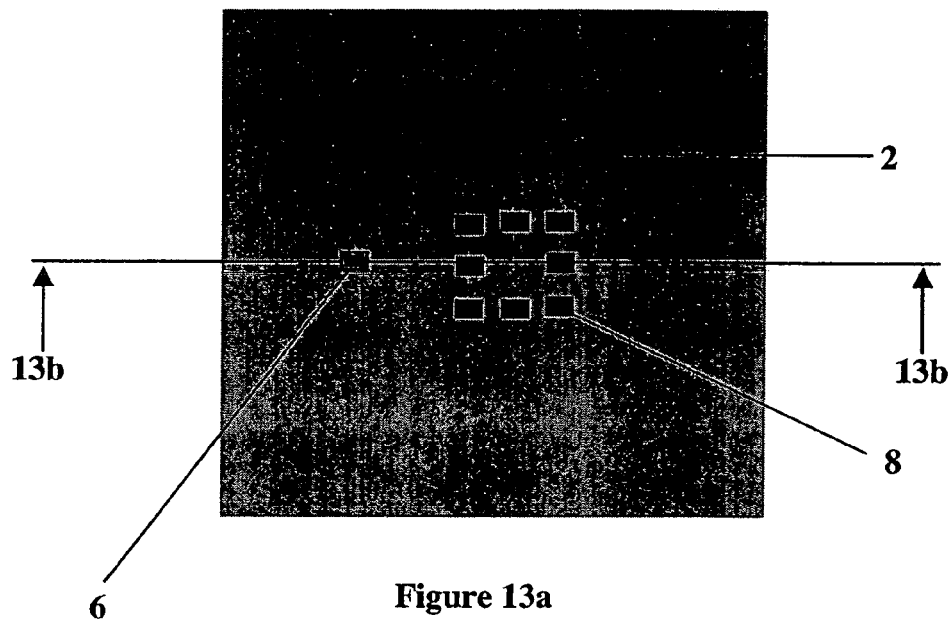
FIG. 13a is a bottom view of the preferred starting material of the base wafer C and FIG. 13b is a cross-sectional view through wafer C of FIG. 13a at line 13b—13b of the base wafer C after hole formation on the bottom of base wafer C.
Figure 13B:
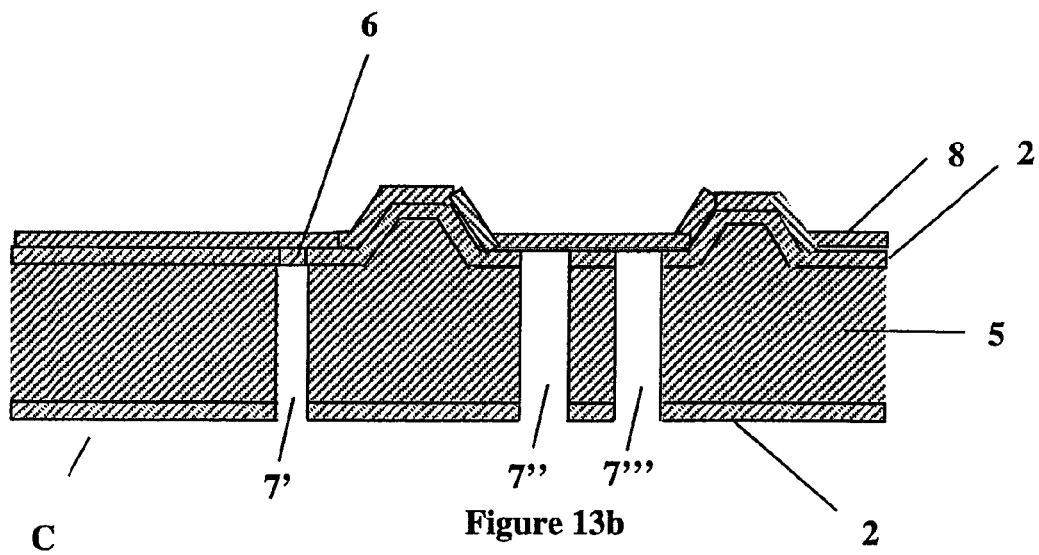

A layer of Ti/Pd/Au 8 was deposited preferably by Sputter Deposition of Ti/Pd/Au on the top surface, as shown in FIGS. 12a and 12b. Pd can be advantageously removed by wet etching.

The following process disclosed in FIGS. 13 to 17 is a preferred process to prepare a preparing a base wafer with through-wafer interconnects as a part of a vacuum packaged integrated microgyro with thru-wafer interconnects. A hole formation was performed to produce holes 7', 7", 7"', in the bottom of wafer C, as shown in FIGS. 13a and 13b.

Figure 14A:
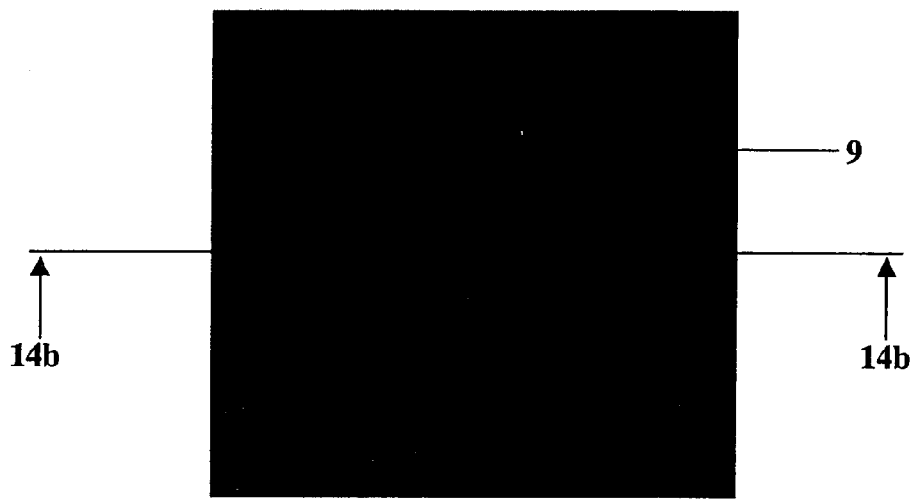
FIG. 14a is a bottom view of the preferred starting material of the base wafer C and FIG. 14b is a cross-sectional view through wafer C of FIG. 14a at line 14b—14b of the base wafer C after dielectric layer deposition on the bottom of base wafer C.
Figure 14B:
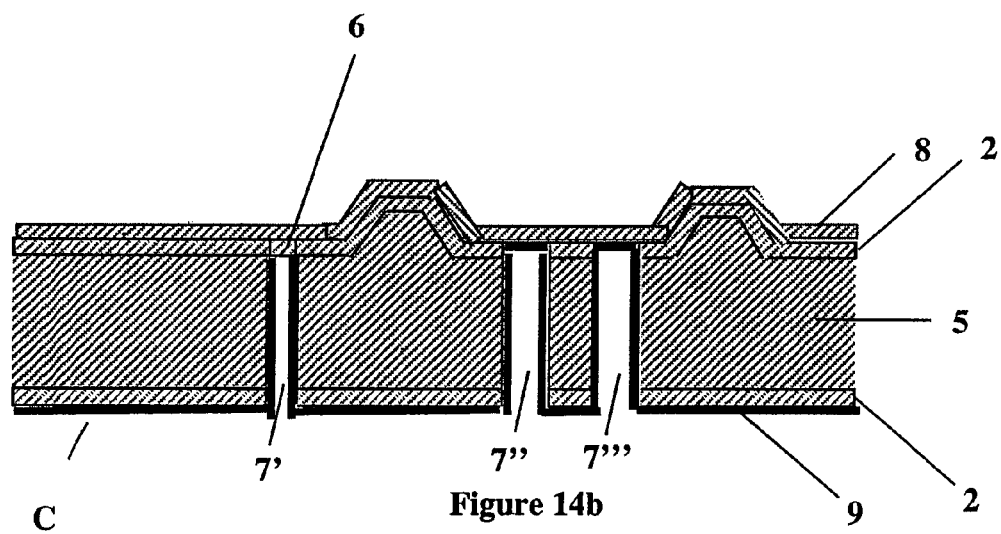

The process preferably comprises:
1. Coating the bottom $SiO_2$ layer 2 of wafer C with a layer of photoresist,
2. Projecting light from an illuminator through a mask that contains the pattern, namely the places for the holes 7 to be created, on the bottom layer 2 of wafer C,
3. Washing the exposed regions of the photoresist layer and leaving an etch mask on the $SiO_2$ layer 2 of the wafer C,
4. Removing the $SiO_2$ layer 2, which is not covered by photoresist, by $CF_4/O_2$ plasma etch,
5. Removing moderate doped Si preferred starting material 5 by Deep DRIE of Si to produce the holes 7,
6. Removing remaining photoresist A $Si_3N_4$ layer 9 is preferably provided on the bottom of base wafer C preferably by PECVD of $Si_3N_4$ deposition, wherein a $Si_3N_4$ layer $9 \leq 1.0$ μm thick is preferably provided, as shown in FIGS. 14a and 14b.

Figure 15A:
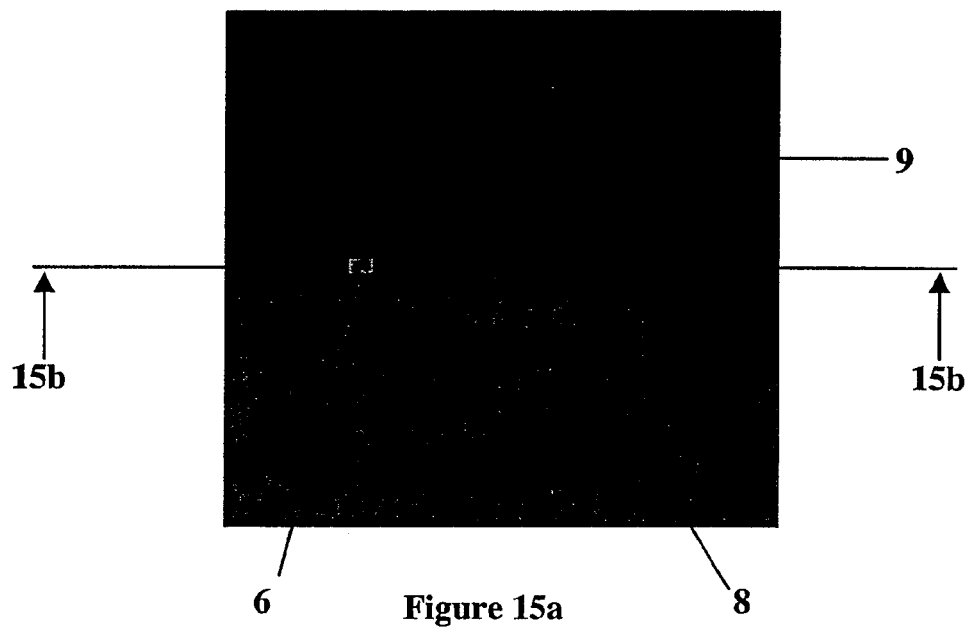
FIG. 15a is a bottom view of the preferred starting material of the base wafer C and FIG. 15b is a cross-sectional view through wafer C of FIG. 15a at line 15b—15b of the base wafer C after Ti metal etch on the bottom of base wafer C.
Figure 15B:
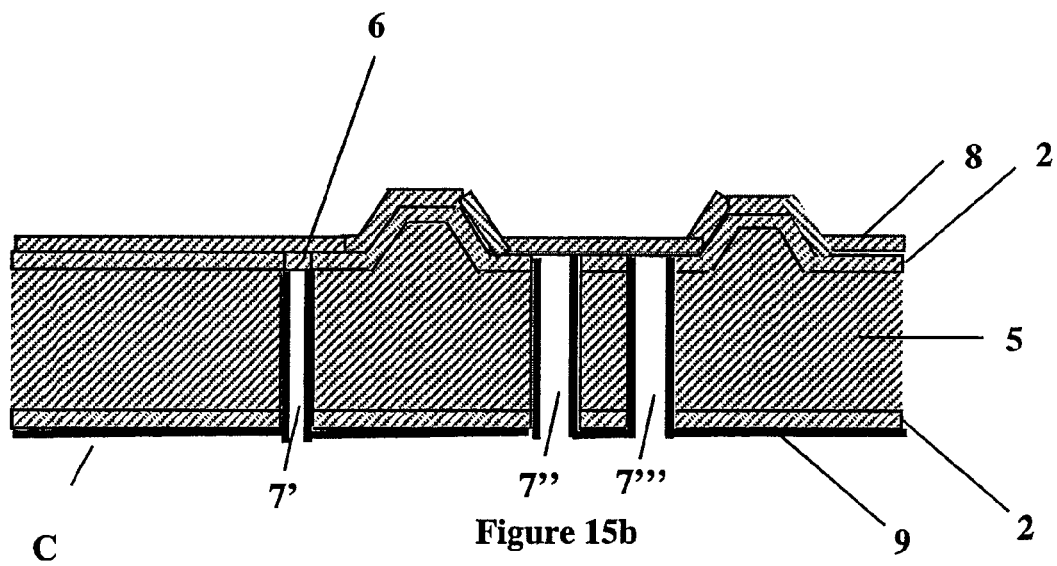

A dielectric layer and Titanium metal etch at the bottom of wafer C is performed. The horizontal layer of $Si_3N_4$ 9 in the holes 7" and 7"' on the bottom of the base wafer C is removed, as shown in FIGS. 15a and 15b.

The process preferably comprises:
1. Coating the bottom $Si_3N_4$ 9 layer of wafer C with a layer of photoresist,
2. Projecting light from an illuminator through a mask that contains the pattern, namely the places for the holes 7 to be created, on the bottom layer 9 of wafer C,
3. Washing the exposed regions of the photoresist layer and leaving an etch mask on the $Si_3N_4$ 9 layer in the holes 7" and 7"' of the wafer C,
4. Removing the $Si_3N_4$ 9 layer in the holes 7" and 7"' which is not covered by photoresist, by $CF_4/O_2$ plasma etch,
5. Ion Mill treatment of Ti metal layer to expose Pd metal of Ti/Pd/Au 8 for electroplating and
6. Removing remaining photoresist.

Figure 16A:
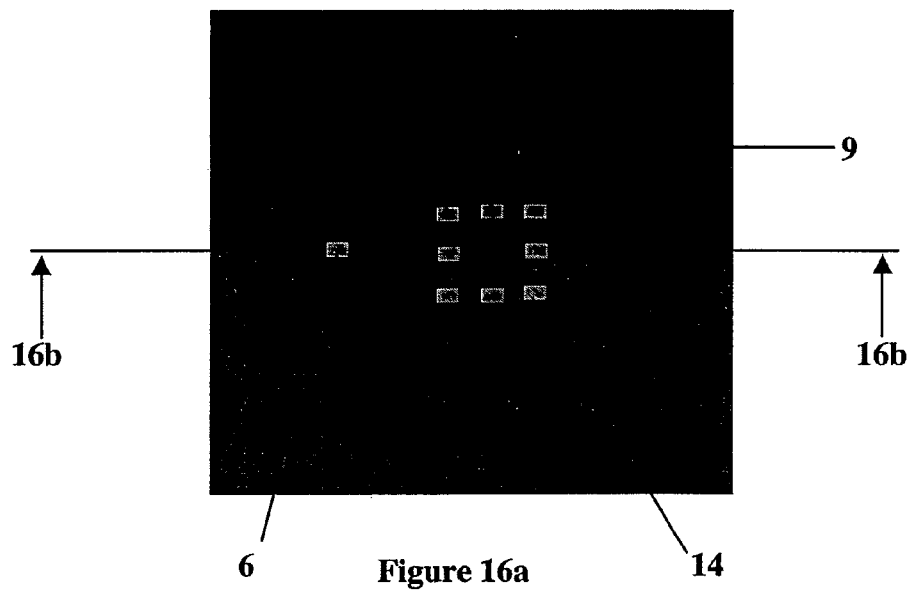
FIG. 16a is a bottom view of the preferred starting material of the base wafer C and FIG. 16b is a cross-sectional view through wafer C of FIG. 16a at line 16b—16b of the base wafer C after hole metal plating on the bottom of base wafer C.
Figure 16B:
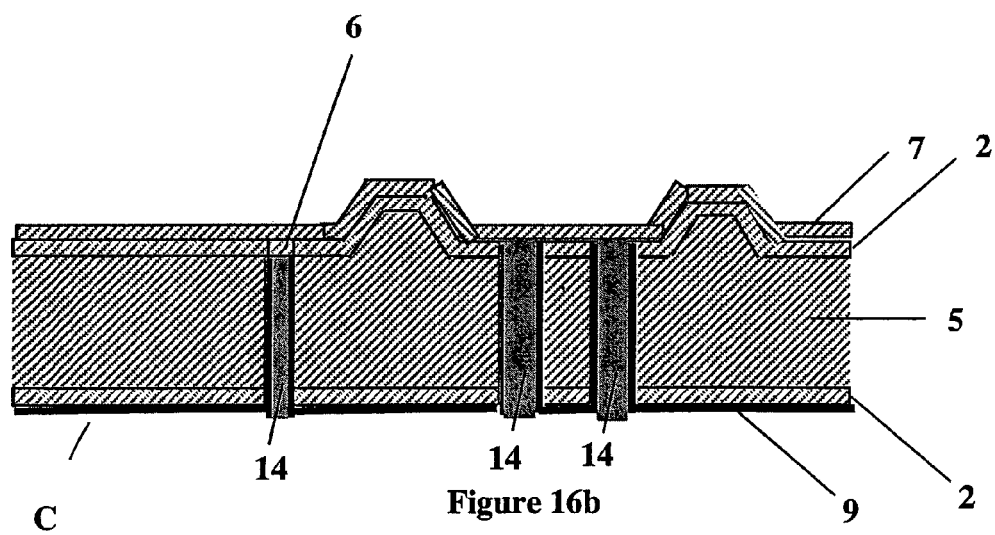

A hole metal plating is carried out at the bottom of wafer C. The holes 7 on the bottom of the base wafer C are electroplated by copper electroplating, as shown in FIGS. 16a and 16b.

The process preferably comprises:
1. Coating the bottom $Si_3N_4$ 9 layer of wafer C with a layer of photoresist,
2. Projecting light from an illuminator through a mask that contains the pattern, namely the places for the holes 7 to be created, on the bottom layer 9 of wafer C,
3. Washing the exposed regions of the photoresist layer and leaving an etch mask on the $Si_3N_4$ 9 layer in the holes 7 of the wafer C,
4. Electroplating with copper 14 in the holes 7, and
5. Removing remaining photoresist.

Figure 17A:
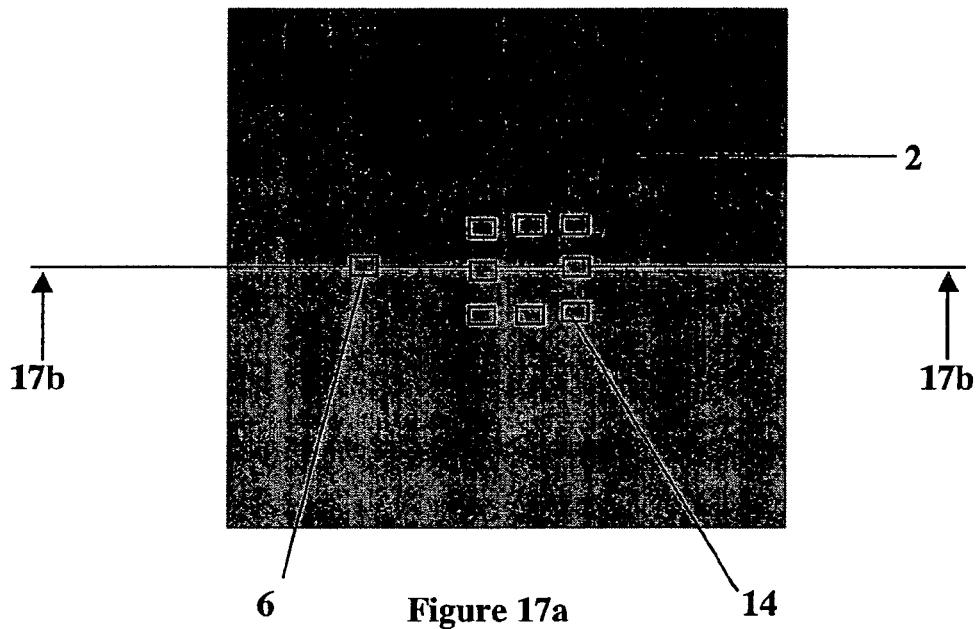
FIG. 17a is a bottom view of the preferred starting material of the base wafer C and FIG. 17b is a cross-sectional view through wafer C of FIG. 17a at line 17b—17b of the base wafer C after dielectric layer removal on the bottom of base wafer C.
Figure 17B:
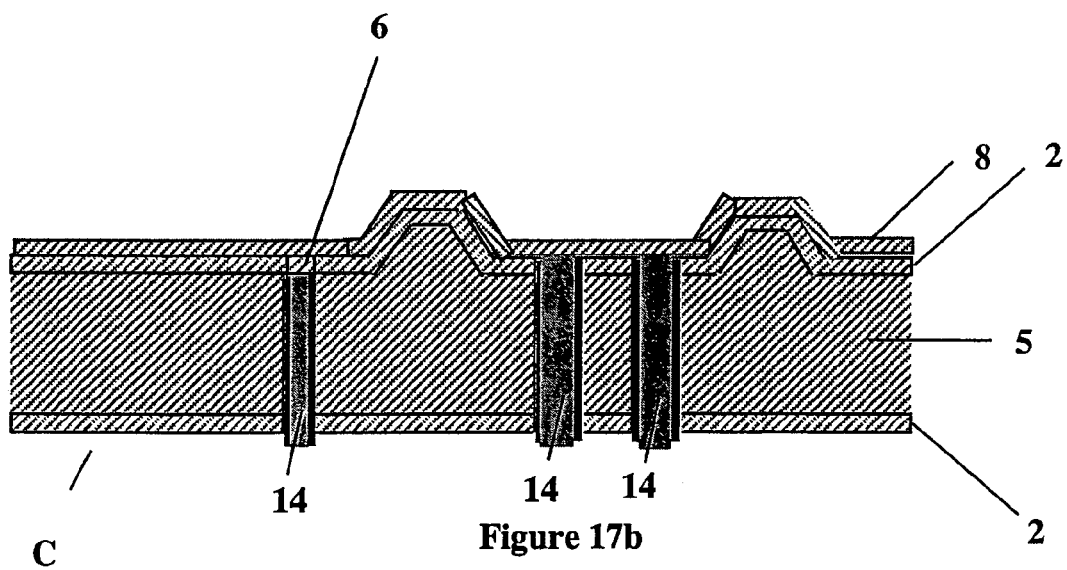

$Si_3N_4$ 9 layer on the bottom of the wafer C was then removed preferably by $CF_4/O_2$ as shown in FIGS. 17a and 17b.

Figure 18A:
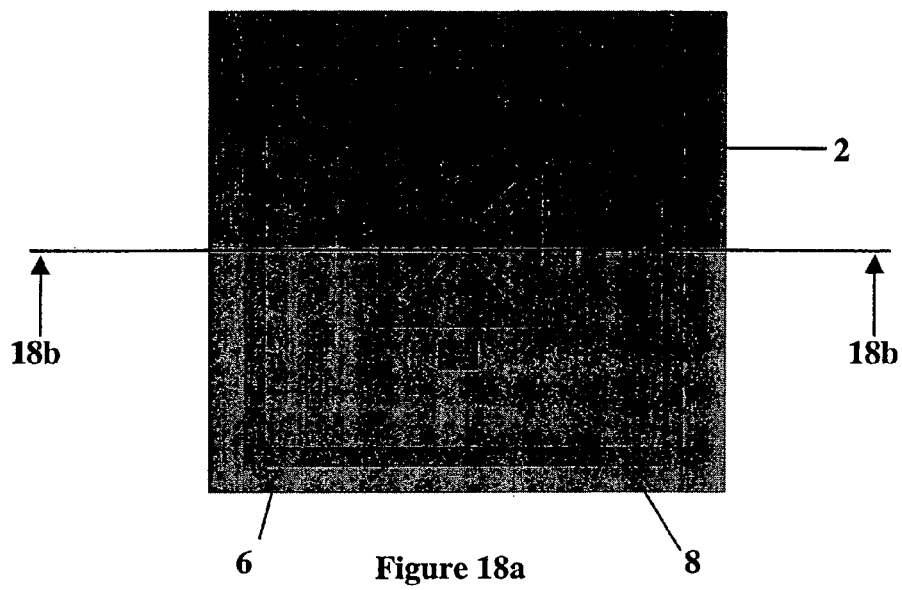
FIG. 18a is a top plan view of the preferred starting material of the base wafer C and FIG. 18b is a cross-sectional view through wafer C of FIG. 18a at line 18b—18b of the base wafer C after front-side electrode and seal ring metal patterning and deposition on the base wafer C.
Figure 18B:
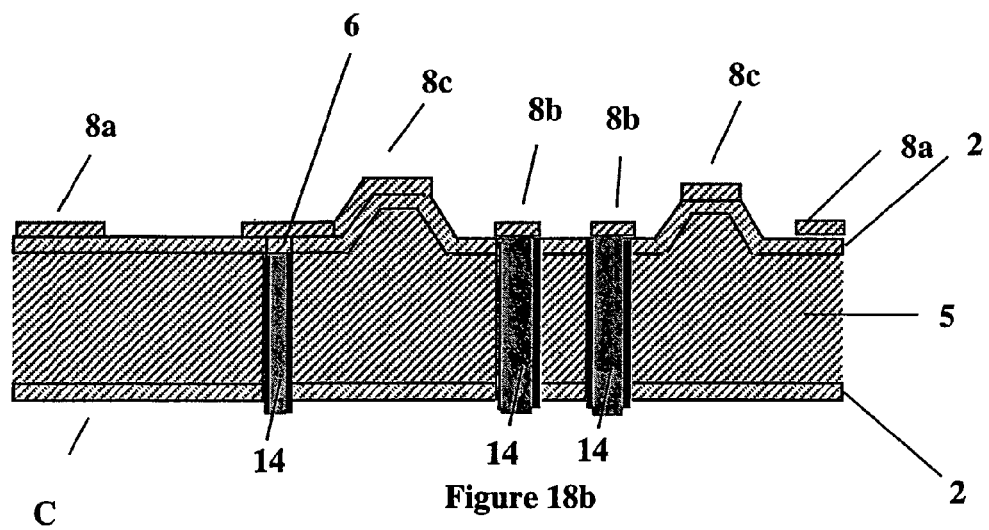

Seal ring metal Ti/Pd/Au 8a, drive/sense electrodes Ti/Pd/Au 8b and wafer bonding metal Ti/Pt/Au 8c may be provided by photoresist lithography and metal deposition and liftoff, as shown in FIGS. 18a and 18b.

The process preferably comprises:
1. Coating the top surface layer Ti/Pd/Au 8 layer of wafer C with a layer of photoresist,
2. Projecting light from an illuminator through a mask that contains the pattern, namely the places were Ti/Pd/Au 8 layer shall be removed on the top of wafer C,
3. Washing the exposed regions of the photoresist layer and leaving an etch mask on the Ti/Pd/Au 8 layer on the wafer C,
4. Wet etching of Ti/Pd/Au 8 and creating seal ring metal Ti/Pd/Au 8a, drive/sense electrodes Ti/Pd/Au 8b and wafer bonding metal Ti/Pt/Au 8c, and
5. Removing remaining photoresist.

Figure 19A:
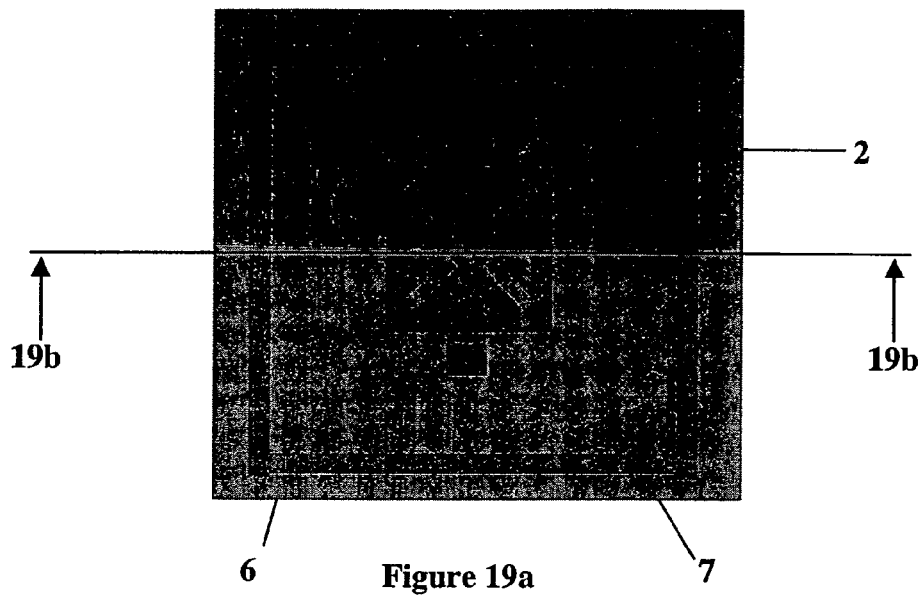
FIG. 19a is a top plan view of the preferred starting material of the base wafer C and FIG. 19b is a cross-sectional view through wafer C of FIG. 19a at line 19b—19b of the base wafer C after a post hole etch is carried out in the base wafer C.
Figure 19B:
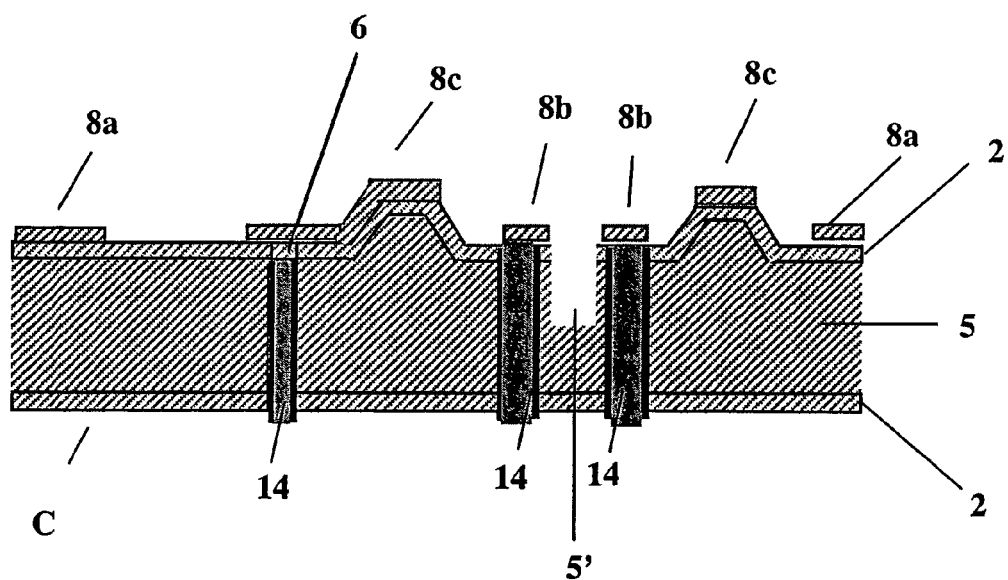

As a next step a post hole etch 5' is preferably carried out by photoresist lithography (spray on thick resist), $CF_4/O_2$ plasma etch of silicon dioxide in the hole region, DRIE of silicon hole and photoresist removal as shown in FIGS. 19a and 19b.

The process preferably comprises:
1. Coating the top surface of wafer C with a layer of photoresist,
2. Projecting light from an illuminator through a mask that contains the pattern, namely the place for the hole region on the top surface of wafer C,
3. Washing the exposed regions of the photoresist layer and leaving a mask on the top surface of the wafer C,
4. $CF_4/O_2$ plasma etch of silicon dioxide in the hole region, 5. DRIE remove to create a silicon hole 5', and
6. Stripping the remaining photoresist layer.

Figure 20A:
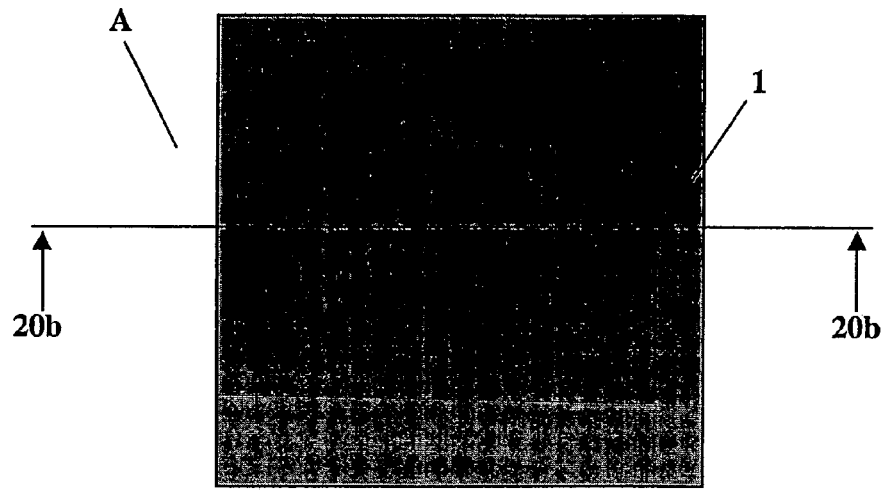
FIG. 20a is a top plan view of the preferred starting material of the bottom surface of wafer A and FIG. 20b is a cross-sectional view through the base wafer A, post B', and base wafer C of FIG. 20a at line 20b—20b of the base wafer A, post B', and base wafer C.
Figure 20B:
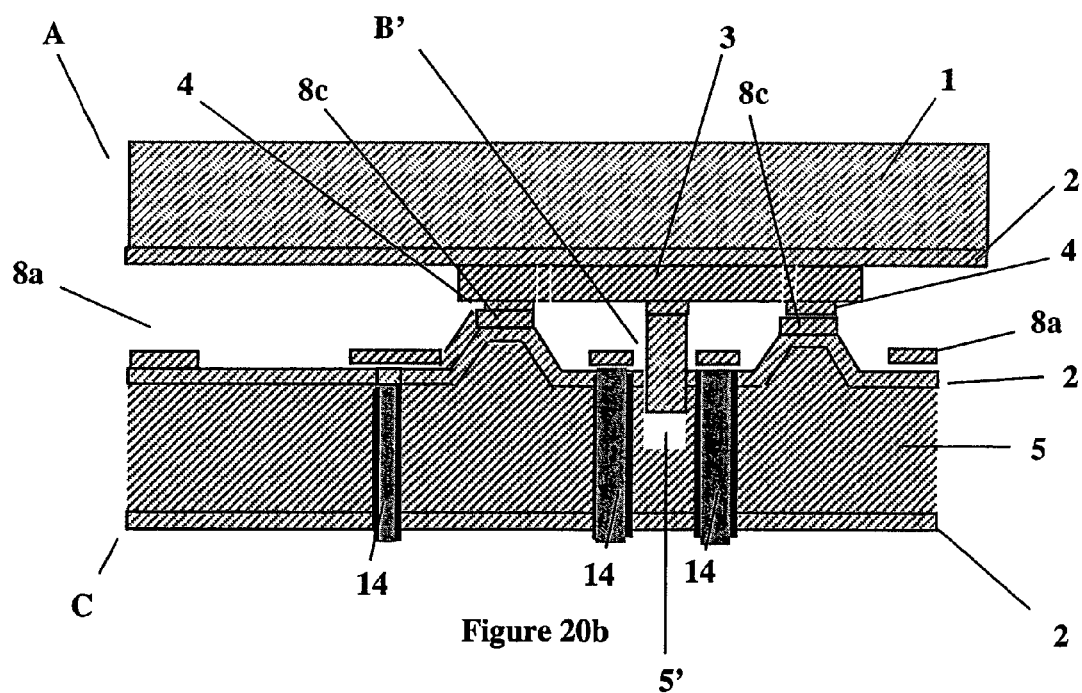

As a next step a bonding of resonator wafer A according to FIG. 6b and to base wafer C according to FIG. 19b is carried out preferably by an Au to Au thermocompression bond at a temperature of 300° C. to 400° C., as shown in FIGS. 20a and 20b. The bonding is carried out between the contacts 4 of resonator wafer A-B and the seal ring metal 8a of the base wafer C. Post B' of resonator wafer A-B fits into the post hole 5' of base wafer C.

Figure 21A:
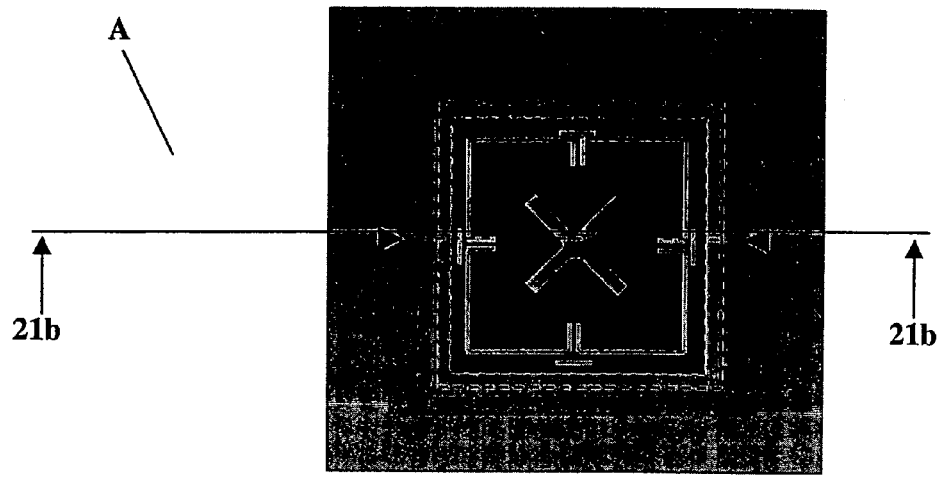
FIG. 21a is a top plan view depicting post A' and base wafer C and FIG. 21b is a cross-sectional view through the base wafer A, post B', and base wafer C of FIG. 21a at line 21b—21b depicting post A', post B', and base wafer C after post formation.
Figure 21B:
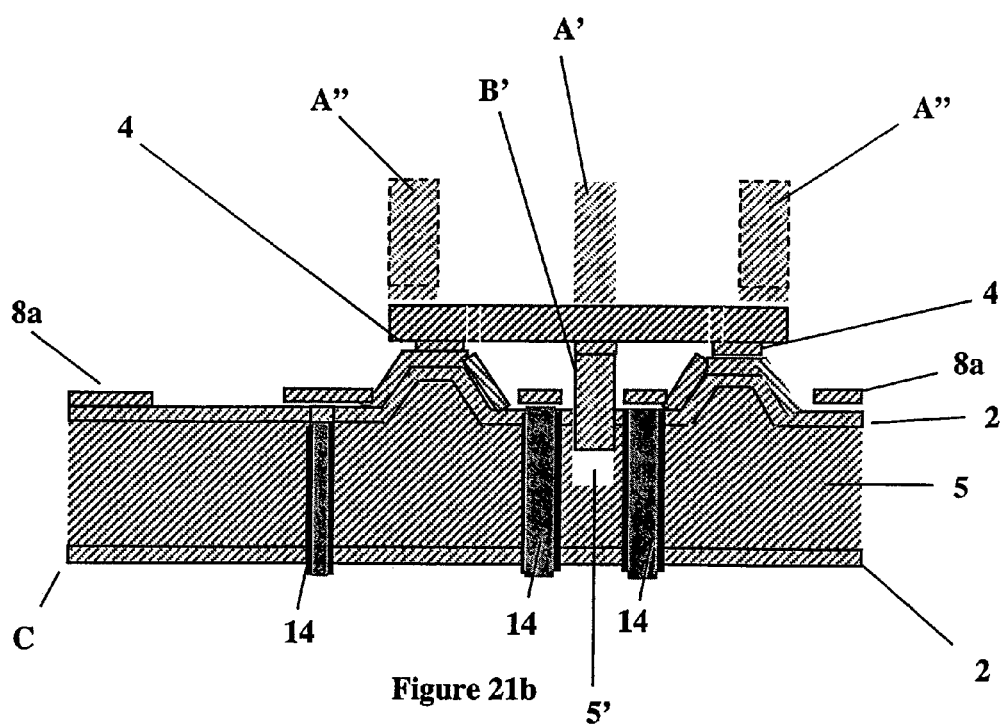

The post fabrication on wafer A is preferably carried out by photoresist lithography (spray on thick resist), $CF_4/O_2$ plasma etching of silicon dioxide, photoresist removal by dry etch. Thereby a post A' and optional frame formation in the top layer A" is obtained, as shown in FIGS. 21a and 21b.

The process preferably comprises:
1. Coating the top surface of wafer A with a layer of photoresist,
2. Projecting light from an illuminator through a mask that contains the pattern, namely the place for the hole region on the top surface of wafer A,
3. Washing the exposed regions of the photoresist layer and leaving a mask on the top surface of the wafer A,
4. DRIE remove of silicon from wafer A,
5. $CF_4/O_2$ plasma etch of silicon dioxide from wafer A, whereby a post A' and optional frame formation in the top layer A" is obtained, and
6. Stripping the remaining photoresist layer.

Figure 22A:
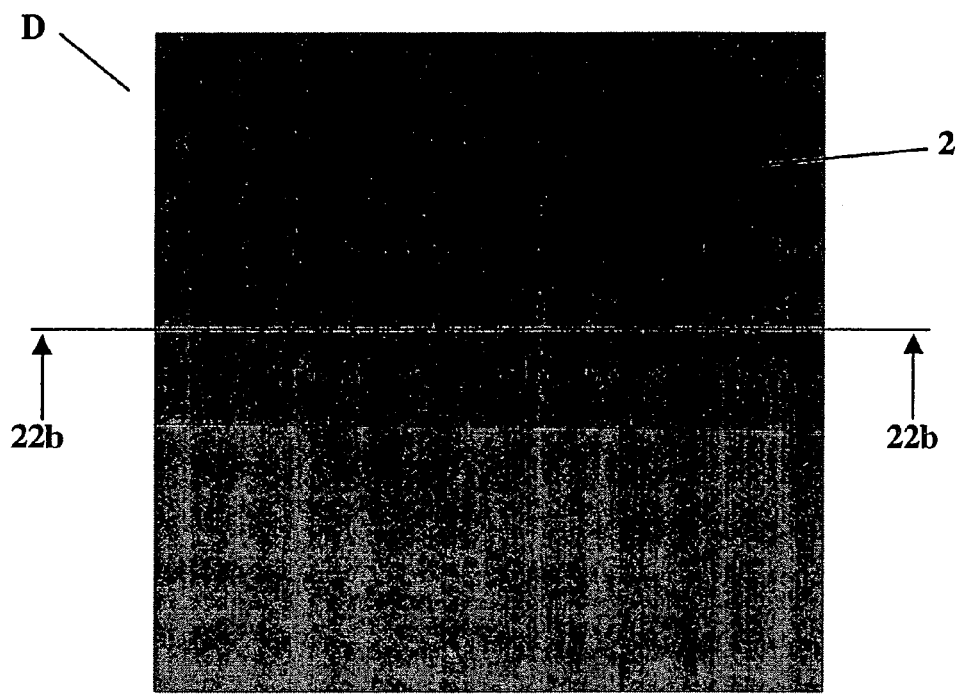
FIG. 22a is a bottom view of the preferred starting material of a cap wafer D and FIG. 22b is a cross-sectional view through the cap wafer D of FIG. 22a at line 22b—22b of the cap wafer D.
Figure 22B:
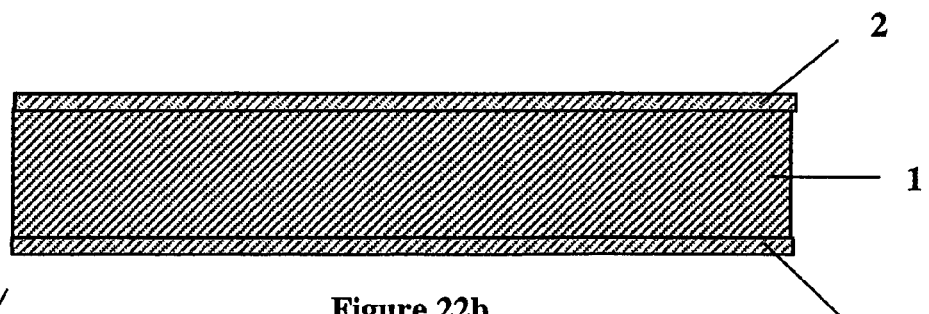

A cap wafer D is prepared with a preferred starting material of lightly doped bulk silicon 1 having a thickness of $\leq 800$ μm and having on top and bottom a thin silicon dioxide layer 2, as shown in FIGS. 22a and 22b.

Figure 23A:
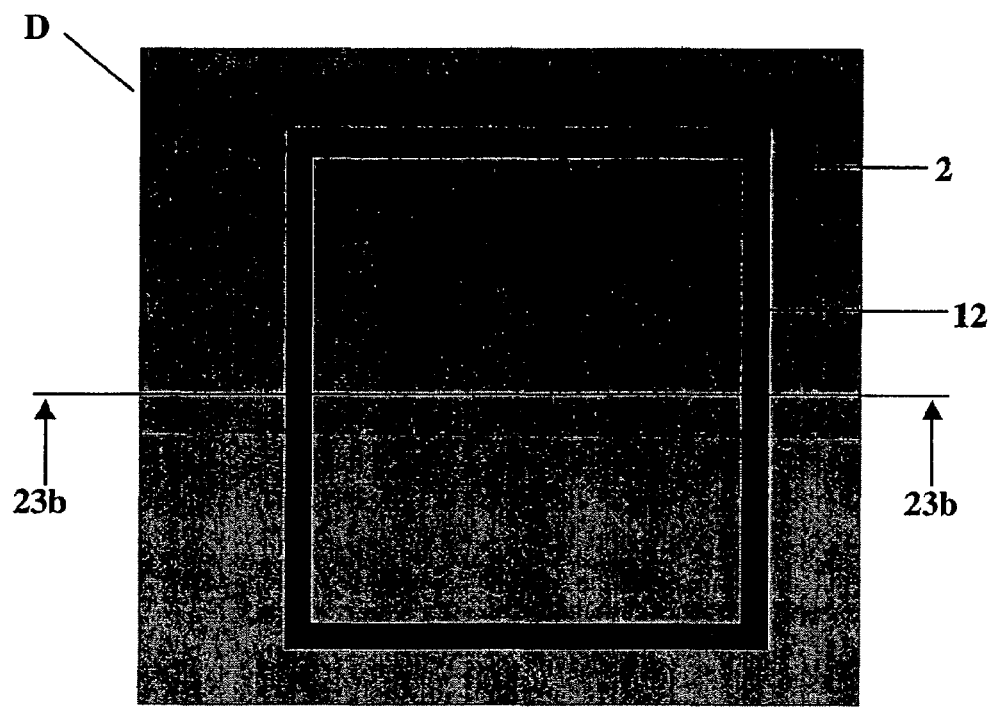
FIG. 23a is a bottom view of the preferred starting material of a cap wafer D and FIG. 23b is a cross-sectional view through the cap wafer D of FIG. 23a at line 23b—23b of the cap wafer D after backside metallization.
Figure 23B:
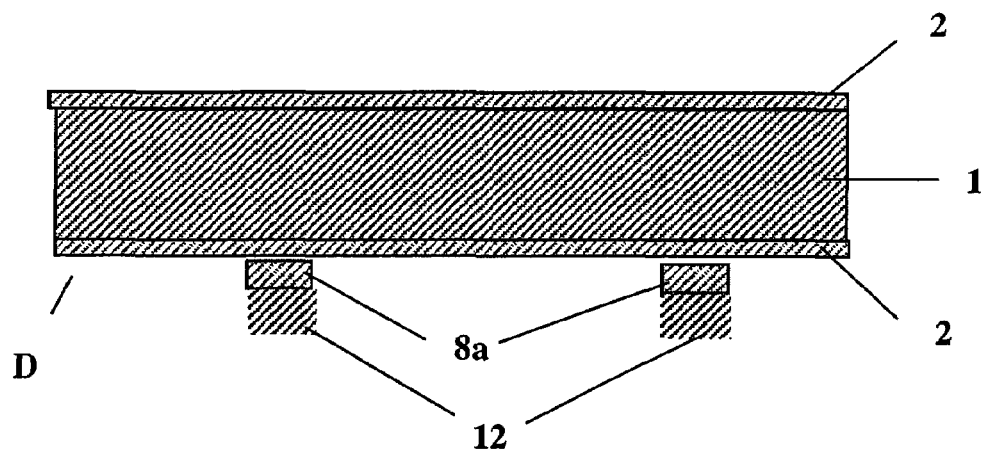

A backside metallization is carried out by photoresist lithography and metal deposition and liftoff. Thereby Ti/Pt/Au 8 and solder metal 12 are attached, as shown in FIGS. 23a and 23b.

The process preferably comprises:
1. Coating the bottom surface of cap wafer D with a layer of photoresist,
2. Projecting light from an illuminator through a mask that contains the pattern, namely the places for seal ring Ti/Pt/Au 8 and solder metal 12 to be attached, on the bottom surface of wafer cap wafer D,
3. Washing the exposed regions of the photoresist layer and leaving a mask on the top surface of the wafer D,
4. Depositing Ti/Pt/Au on the bottom surface of cap wafer D,
5. Depositing solder metal 12 on the bottom surface of cap wafer D,
6. Removing excess Ti/Pt/Au 8 and solder metal 12 covering the photoresist by a metal lift-off process,
7. Stripping remaining photoresist yielding a seal ring Ti/Pt/Au 8 and solder metal 12.

Figure 24A:
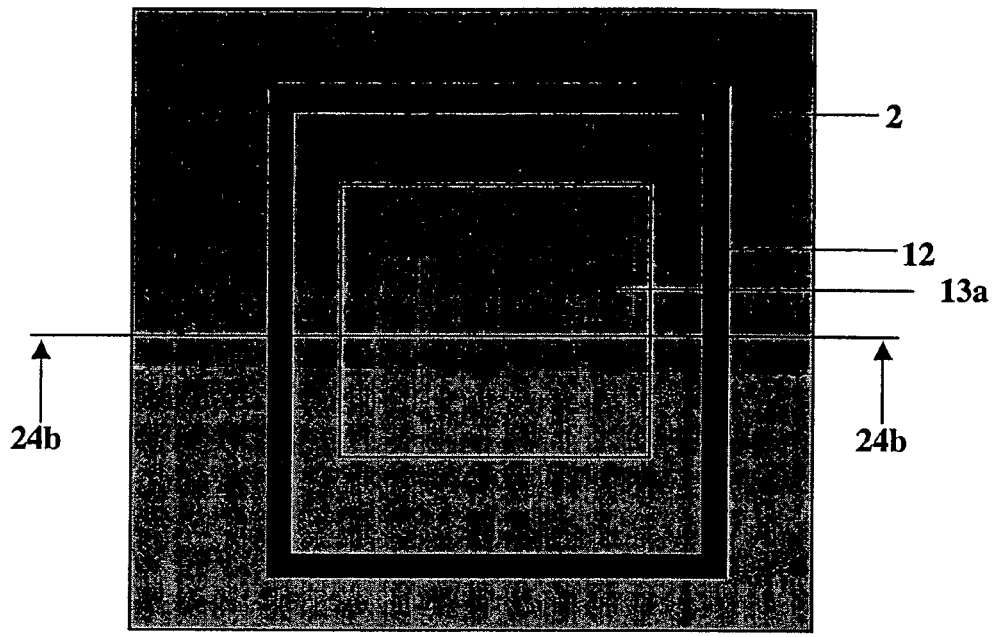
FIG. 24a is a bottom view of the preferred starting material of a cap wafer D and FIG. 24b is a cross-sectional view through the cap wafer D of FIG. 24a at line 24b—24b of the cap wafer D after forming of backside cavity.
Figure 24B:
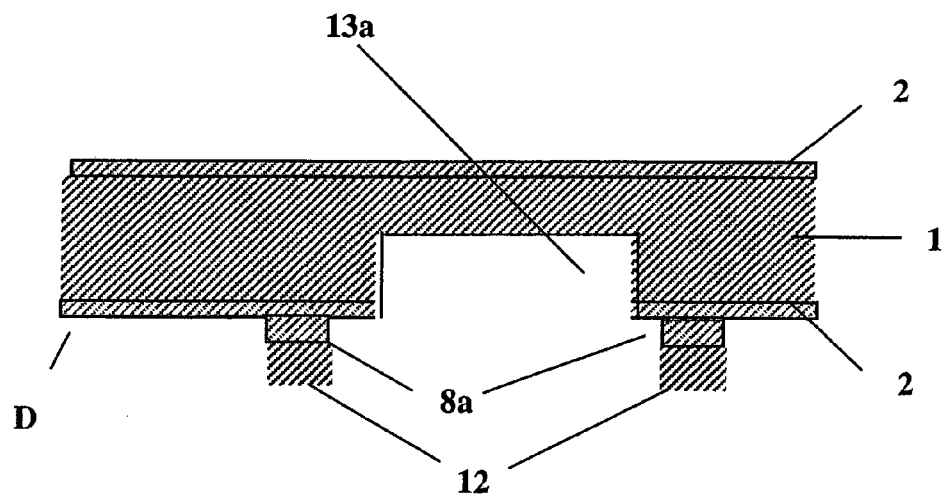

Then backside cavity 13a is preferably formed on the cap wafer D by spraying thick photoresist on the backside, DRIE etch of $SiO_2$, DRIE cavities and remove photoresist, as shown in FIGS. 24a and 24b.

The process preferably comprises:
1. Coating the bottom silicon dioxide layer 2 of the cap wafer D with a layer of photoresist,
2. Projecting light from an illuminator through a mask that contains the pattern to be created on bottom layer 2 of the cap wafer D,
3. Washing the exposed regions of the photoresist layer and leaving an etch mask on the bottom silicon dioxide layer 2 of the cap wafer E,
4. Removing $SiO_2$ layer 2 of wafer B by $CF_4/O_2$ plasma etch,
5. Etching silicon layer 1 unprotected with photoresist by gases utilizing the deep reactive ion etch (DRIE) on the bottom of the cap wafer D, and
6. Removing photoresist from the bottom silicon dioxide layer 2 of the cap wafer D yielding two cavities 13.

Figure 25A:
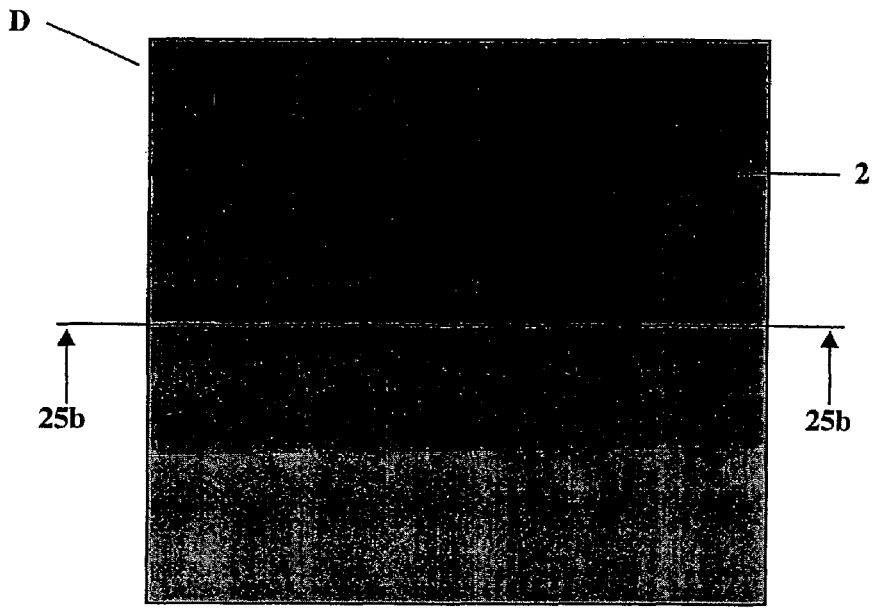
FIG. 25a is a top plan view of the preferred starting material of a cap wafer D and FIG. 25b is a cross-sectional view through the cap wafer D and the base wafer C of FIG. 25a at line 25b—25b of the cap wafer D bonded to the base wafer C.
Figure 25B:
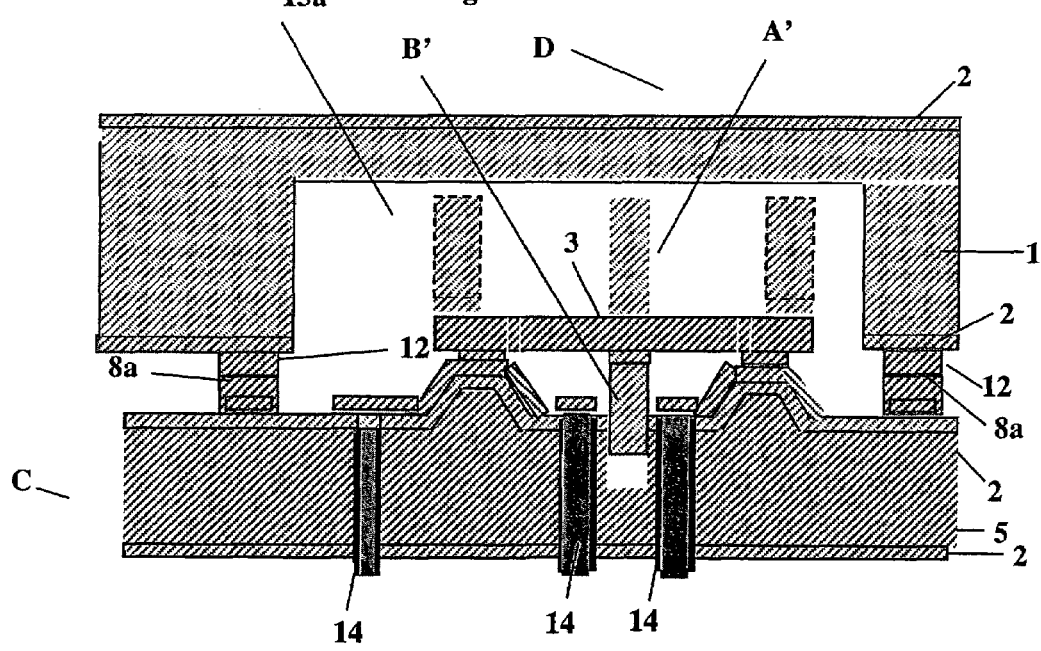

The cap wafer D is preferably bonded to the base wafer C. The cap wafer D is positioned on top of base wafer C. A solder bond is carried out at low temperature at about 200° C. between the solder metal 12 of the cap wafer D and the seal ring metal 8a of the base wafer C, as shown in FIGS. 25a and 25b.

The present invention can be used for cell phone applications where the gyros are mounted directly on a PC board. In addition, for high g applications, the changes in the stray capacitance that can occur if the wire bonded interconnects move can create false signals and noise. Finally, if vertical stacking of the Si microgyro with its ASIC is desirable for 3-D (but separate wafer) integration, ball-grid array interconnect techniques are necessary.

This invention is extremely important in the overall packaging concepts for I*Star inertial instruments. Different customers require different package and interconnect designs for use in their products. Automotive users still prefer to use wire bonding and plastic hybrid packages for many of their applications. However, other users such as wireless manufacturers or military users such as Raytheon will require even lower cost and more rugged packaging concepts. In general, the IC industry is moving toward ball-grid array technology for advanced packaging designs.

Finally, the manufacturing yield and vacuum lifetime may be improved with the present design since the solder on the capping wafer seal ring makes a vacuum seal to a completely planar metal seal ring on the base wafer. The previous design could produce undulations in the bottom seal ring due to the Ti/Al interconnects.

Although certain preferred embodiments of the present invention have been described above, these should not be construed as limiting the scope of the invention but as merely providing illustrations of some of the presently preferred embodiments of this invention. Those skilled in the art will appreciate the fact that both the order in which the described processes are carried out and the described process parameters may be varied if needed to suit local requirements.

What we claim is:

1. A method of manufacturing a cloverleaf microgyroscope containing an integrated post comprising:
    a) attaching a post wafer to a resonator wafer,
    b) forming a bottom post from the post wafer,
    c) preparing a base wafer with through-wafer interconnects,
    d) attaching the resonator wafer to the base wafer, wherein the bottom post fits into a post hole in the base wafer,
    e) forming a top post from the resonator wafer, wherein the bottom and top post are formed symmetrically around the same axis, and
    f) attaching a cap wafer on top of the base wafer.

2. The method according to claim 1, wherein the through-wafer interconnects comprise copper, copper alloys and mixtures thereof.

3. The method according to claim 1, wherein the top post is formed of a bulk silicon base having a thickness of $\leq 500$ μm, a silicon dioxide layer of $\leq 2$ μm and a heavily-doped Silicon epi-layer of 10 μm–20 μm, p-type, 1e19–1e20 $cm^{-3}$.

4. The method according to claim 1, wherein the bottom post is formed of a bulk silicon base having a thickness of $\leq 500$ μm and a silicon dioxide layer of $\leq 2$ μm.

5. The method according to claim 1, wherein the base wafer is manufactured of substrate containing moderately doped silicon substrate p-type, 1e19 cm$^{-3}$ with a thickness of about $\leq 800$ μm.

6. The method according to claim 1, wherein ohmic contacts and interconnect metals containing Al or Al/Ti are formed preferably on the base wafer before the resonator wafer is attached to the base wafer.

7. The method according to claim 1, wherein electrodes, bond pad, and wire bond metal are formed on the base wafer before the resonator wafer is attached to the base wafer.

8. The method according to claim 1, wherein electrodes, bond pad, and wire bond metal are formed on the base wafer before the resonator wafer is attached to the base wafer.

9. The method according to claim 1, wherein a seal ring containing Ti/Pt/Au is formed on the base wafer before the resonator wafer is attached to the base wafer.

10. The method according to claim 1, wherein the cap wafer is manufactured of lightly doped bulk silicon having a thickness of $\leq 800$ μm.

11. The method according to claim 1, wherein an opening is prepared in the cap wafer, a wire is led through the opening in the cap wafer and bonded to a bonding pad on the base wafer.

12. The method according to claim 1, wherein parts of heavily doped silicon layer of the resonator wafer are removed by resist lithography and photoresist removal.

13. The method according to claim 1, wherein the bondage between heavily-doped silicon epi-layer of the resonator and silicon dioxide layer of the post wafer is achieved by heating at a temperature from 800° C. to 1000° C.

14. The method according to claim 1, wherein bulk silicon layer and silicon dioxide of the post wafer are partially removed to yield the bottom post by resist lithography, $CF_4/O_2$ plasma etch $SiO_2$ and removal of photoresist.

15. The method according to claim 1, wherein the bonding of the resonator wafer to the base wafer is carried out by an Au to Au thermo-compression bonding at a temperature from 200° C. to 500° C.

16. The method according to claim 1, wherein a bulk silicon layer and silicon dioxide of the resonator wafer are partially removed to yield a top post by resist lithography, $CF_4/O_2$ plasma etch of $SiO_2$ and removal of photoresist.

17. The method according to claim 1, wherein the bondage between the cap wafer and the base wafer is carried out with solder metal at a temperature at about 100° C. to 300° C.

18. The method according to claim 1, wherein a hole in the cap wafer is formed by wet etch of silicon and vacuum oven baking.

19. The method according to claim 1, wherein the wire bonding is carried out by saw cutting of cap wafer and ball bonding of wires to wire bonding pad of the base wafer.

* * * * *